US012464881B2

(12) United States Patent
Jeon et al.

(10) Patent No.: US 12,464,881 B2
(45) Date of Patent: Nov. 4, 2025

(54) DISPLAY DEVICE

(71) Applicant: Samsung Display Co., LTD., Yongin-si (KR)

(72) Inventors: Si-Wan Jeon, Hwaseong-si (KR); Jeong Ki Kim, Hwaseong-si (KR); Jea Heon Ahn, Hwaseong-si (KR); Myoung Jong Lee, Cheonan-si (KR); Seok-Joon Hong, Seongnam-si (KR); Tae Hyung Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 611 days.

(21) Appl. No.: 17/220,531

(22) Filed: Apr. 1, 2021

(65) Prior Publication Data

US 2021/0318474 A1 Oct. 14, 2021

(30) Foreign Application Priority Data

Apr. 14, 2020 (KR) ........................ 10-2020-0045189

(51) Int. Cl.
*G02B 5/20* (2006.01)
*G02B 5/00* (2006.01)
(Continued)

(52) U.S. Cl.
CPC ........... *H10H 29/142* (2025.01); *G02B 5/003* (2013.01); *G02B 5/20* (2013.01); *H10K 50/865* (2023.02);
(Continued)

(58) Field of Classification Search
CPC .......... G02B 5/20; G02B 5/003; G02B 5/201; H10K 50/865; H10K 59/38; H10K 59/12;
(Continued)

(56) References Cited

U.S. PATENT DOCUMENTS 11,119,375 B1 * 9/2021 Zhang ............... G02F 1/136218
2008/0198308 A1 8/2008 Lee et al.
(Continued)

FOREIGN PATENT DOCUMENTS

CN 104752482 A 7/2015
CN 108535910 A 9/2018
(Continued)

*Primary Examiner* — Meiya Li
(74) *Attorney, Agent, or Firm* — CANTOR COLBURN LLP

(57) ABSTRACT

A display device includes: a substrate, where a first pixel area, a second pixel area, and a third pixel area which are defined on the substrate; and a plurality of light blocking members disposed on the substrate between the pixel areas. The light blocking members include a plurality of first light blocking members continuously extends along a first direction between the first, second and third pixel areas, and a second light blocking member disposed along a second direction perpendicular to the first direction, the second light blocking member is disposed between neighboring third pixel areas which neighbor each other in the first direction, and a width of the first light blocking member and a width of the second light blocking member are substantially the same as each other.

20 Claims, 37 Drawing Sheets

(51) Int. Cl.
  *H10H 29/14* (2025.01)
  *H10K 50/86* (2023.01)
  *H10K 59/38* (2023.01)
  *H01L 25/16* (2023.01)
  *H10K 59/12* (2023.01)

(52) U.S. Cl.
  CPC ............ *H10K 59/38* (2023.02); *H01L 25/167* (2013.01); *H10K 59/12* (2023.02)

(58) Field of Classification Search
  CPC .... H10K 59/35; H10K 59/126; H01L 25/167; H01L 27/156; H01L 33/504; H01L 33/58; H01L 33/50; H10H 20/8513; H10H 20/855; H10H 29/142
  See application file for complete search history.

(56) References Cited

U.S. PATENT DOCUMENTS

| | | |
|---|---|---|
| 2013/0329155 A1 | 12/2013 | Kwak et al. |
| 2014/0098315 A1 | 4/2014 | Jung et al. |
| 2015/0188095 A1 | 7/2015 | Yoo et al. |
| 2016/0004132 A1* | 1/2016 | Lin .................. G02F 1/136209 349/110 |
| 2016/0274409 A1 | 9/2016 | Kang et al. |
| 2017/0076678 A1 | 3/2017 | Lee et al. |
| 2017/0084644 A1 | 3/2017 | Kang et al. |
| 2019/0179065 A1 | 6/2019 | Kim et al. |
| 2020/0089047 A1* | 3/2020 | Baek ...................... H10K 71/00 |

FOREIGN PATENT DOCUMENTS

| | | |
|---|---|---|
| KR | 100801151 B1 | 2/2008 |
| KR | 1020080076481 A | 8/2008 |
| KR | 1020100032194 A | 3/2010 |
| KR | 1020130137457 A | 12/2013 |
| KR | 1020160113379 A | 9/2016 |
| KR | 1020170035408 A | 3/2017 |
| KR | 1020180035287 A | 4/2018 |
| KR | 1020180044474 A | 5/2018 |
| KR | 1020180087502 A | 8/2018 |
| KR | 1020200031750 A | 3/2020 |

* cited by examiner

DISPLAY DEVICE

This application claims priority to Korean Patent Application No. 10-2020-0045189, filed on Apr. 14, 2020, and all the benefits accruing therefrom under, and all the benefits accruing therefrom under 35 U.S.C. § 119, the content of which in its entirety is herein incorporated by reference.

BACKGROUND (a) Field

The disclosure relates to a display device, and more particularly, to a display device including a color conversion panel.

(b) Description of the Related Art

In a light emitting element, an exciton is formed by combining a hole supplied from an anode and an electron supplied from a cathode in an emission layer formed between the anode and the cathode, and light is emitted while the exciton is stabilized.

Since light emitting elements have various desired characteristics such as a wide viewing angle, a fast response speed, a thin thickness, and low power consumption, such light emitting elements are widely applied to various electric and electronic devices such as televisions, monitors, and mobile phones.

SUMMARY

Recently, a display device including a color conversion layer has been proposed to implement a display device with high efficiency. The color conversion layer displays an image by color conversion of light emitted from a light emitting element.

In such a display device, a light blocking member may be provided between neighboring color conversion layers to prevent the color conversion layers from being mixed. In this case, it is desired to accurately measure the width of the light blocking member during a process.

Embodiments provide a display device in which a width of a light blocking member are precisely measured and controlled during a process.

An embodiment of a display device according to the invention includes: a substrate, where a first pixel area, a second pixel area and a third pixel area are defined on the substrate; and a plurality of light blocking members disposed on the substrate between the first, second and third pixel areas. In such an embodiment, the light blocking members include a plurality of first light blocking members which continuously extends along a first direction between the first, second and third pixel areas, and a second light blocking member disposed along a second direction perpendicular to the first direction, the second light blocking member is disposed between neighboring third pixel areas which neighbor each other in the first direction, and a width of the first light blocking member and a width of the second light blocking member are substantially the same as each other.

In an embodiment, the display device may further include: a third color filter disposed directly on the substrate, where a first opening maybe defined through the third color filter to overlap the first pixel area and a second opening may be defined through the third color filter to overlap the second pixel area; a first color filter disposed in the first opening; and a second color filter disposed in the second opening.

In an embodiment, the display device may further include: a first color conversion layer disposed to overlap the first color filter; a second color conversion layer disposed to overlap the second color filter; and a transmission layer disposed to overlap the third color filter.

In an embodiment, the display device may further include: a plurality of third light blocking members disposed at a distance from each other in the second direction on the substrate; a first color filter overlapping the first pixel area, a second color filter overlapping the second pixel area, and a third color filter overlapping the third pixel area, where the first, second, and third color filters are disposed between the neighboring third light blocking members; a first color conversion layer disposed to overlap the first color filter; a second color conversion layer disposed to overlap the second color filter; and a transmission layer disposed to overlap the third color filter.

In an embodiment, the first pixel area may emit red light, the second pixel area emits green light, and the third pixel area may emit blue light.

In an embodiment, a first light blocking member among the first light blocking members may be disposed between the second pixel area and the third pixel area, the second light blocking member may be connected to the first light blocking member, and the second light blocking member may be disposed between neighboring second pixel areas which neighbor each other in the first direction and between neighboring third pixel areas which neighbor each other in the first direction.

In an embodiment, a first light blocking member among the first light blocking members may be disposed between the second pixel area and the third pixel area, the second light blocking member may be spaced apart from the first light blocking member, and the second light blocking member may be disposed between neighboring second pixel areas which neighbor each other in the first direction and between neighboring third pixel areas which neighbor each other in the first direction.

In an embodiment, a first light blocking member among the first light blocking members may be disposed between the second pixel area and the third pixel area, and the second light blocking member may be connected to the first light blocking member.

In an embodiment, a first light blocking member among the first light blocking members may be disposed between the second pixel area and the third pixel area, and the second light blocking member may be spaced apart from the first light blocking member.

In an embodiment, a first light blocking member among the first light blocking members may be disposed between the first pixel area and the third pixel area, the second light blocking member may be connected to the first light blocking member, and the second light blocking member may be disposed between neighboring first pixel areas which neighbor each other in the first direction and between neighboring third pixel areas which neighbor each other in the first direction.

In an embodiment, a first light blocking member among the first light blocking members may be disposed between the first pixel area and the third pixel area, the second light blocking member may be spaced apart from the first light blocking member, and the second light blocking member may be disposed between neighboring first pixel areas which neighbor each other in the first direction and between neighboring third pixel areas which neighbor each other in the first direction.

In an embodiment, the second light blocking member may be spaced apart from the first light blocking member, and the second light blocking member may be disposed between neighboring first pixel areas which neighbor each other in the first direction, between neighboring second pixel areas which neighbor each other in the first direction, and between neighboring third pixel areas which neighbor each other in the first direction.

In an embodiment, the display device may include: a display substrate which overlaps the substrate; and a plurality of light emitting diodes disposed on the display substrate, where the light emitting diodes may overlap the first, second and third pixel areas, respectively, and the light emitting diodes may emit blue light.

An embodiment of a display device according to the invention includes: a substrate; a first color conversion layer, a second color conversion layer, and a transmission layer which are disposed on the substrate, and each of which continuously extends in a first direction; a plurality of light blocking members disposed on the first color conversion layer, the second color conversion layer, and the transmission layer, where the first color conversion layer, the second color conversion layer, and the transmission layer may be spaced apart from each other in a second direction perpendicular to the first direction, and the light blocking members may include a first light blocking member which continuously extends along the first direction, and fill separation spaces between the first color conversion layer, the second color conversion layer and the transmission layer; and a second light blocking member disposed in the second direction, where a width of the first light blocking member and a width of the second light blocking member are substantially the same as each other.

In an embodiment, the second light blocking member may be disposed on the transmission layer.

In an embodiment, the second light blocking member may be connected to the first light blocking member.

In an embodiment, the second light blocking member may be disposed on the first color conversion layer or the second color conversion layer.

In an embodiment, the second light blocking member may be spaced apart from the first light blocking member.

In an embodiment, the second light blocking member may be disposed on the first color conversion layer or the second color conversion layer.

In an embodiment, the first color conversion layer may convert blue light to red light, and the second color conversion layer may convert blue light to green light.

According to embodiments a display device, a width of a light blocking member may be precisely measured and controlled during a process.

DETAILED DESCRIPTION

Figure 1:
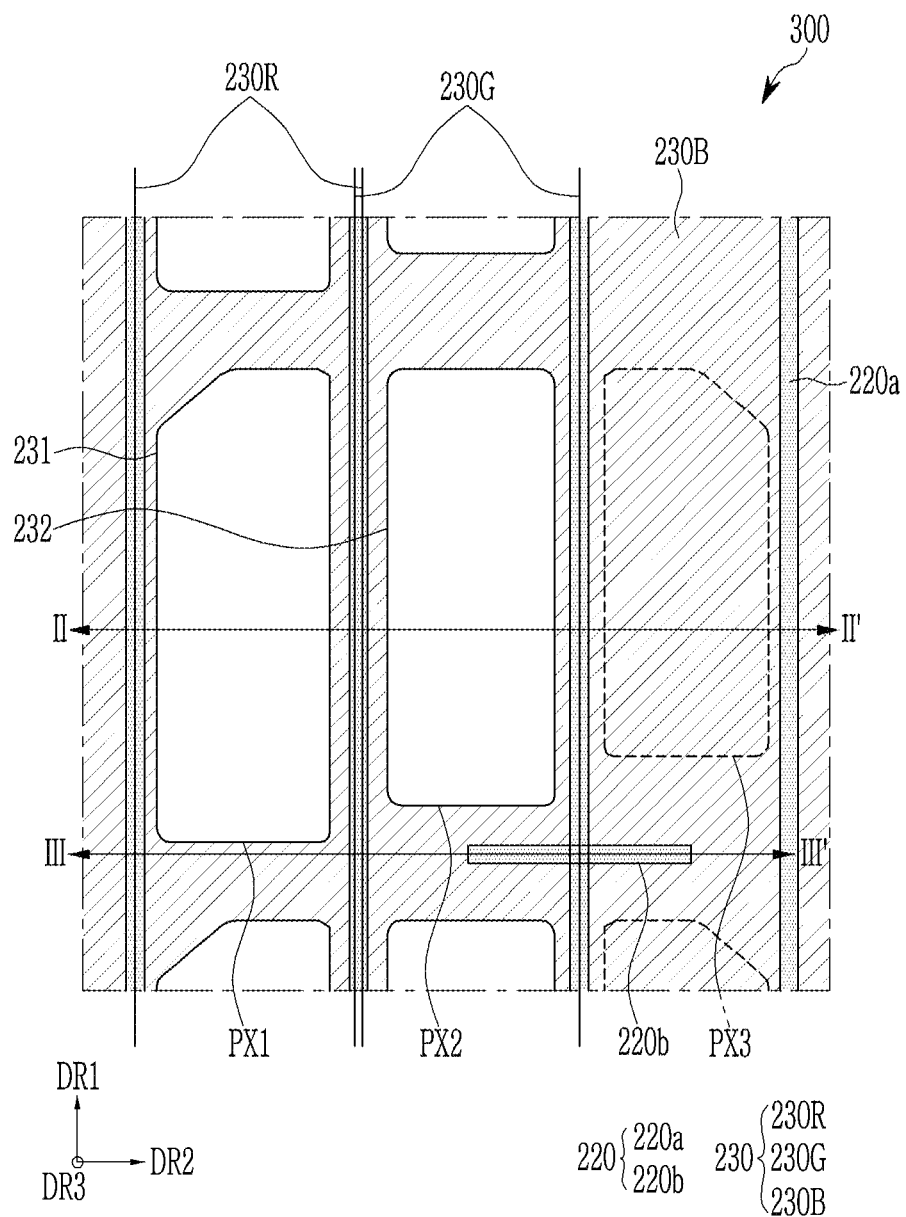
FIG. 1 is a top plan view that schematically illustrates a color conversion panel of a display device according to an embodiment of the invention.

The invention will now be described more fully with reference to the accompanying drawings, in which various embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The drawings and description are to be regarded as illustrative in nature and not restrictive. Like reference numerals designate like elements throughout the specification.

In addition, since the size and thickness of each component shown in the drawings are arbitrarily shown for better understanding and ease of description, the invention is not necessarily limited to what is shown. In the drawings, the thickness of layers, films, panels, regions, etc., are exaggerated for clarity. In addition, in the drawings, for better understanding and ease of description, the thickness of some layers and regions is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" with respect to a target element will be understood to be positioned above or below the target element and is not necessarily to be understood to be positioned "at an upper side" based on a direction opposite to that of gravity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Further, throughout the specification, the phrase "on a plane" means viewing a target portion from the top, and the phrase "on a cross-section" means viewing a cross-section formed by vertically cutting a target portion from the side.

Hereinafter, embodiments of a display device according to the invention will be described in detail with reference to the accompanying drawings.

FIG. 1 is a top plan view that schematically illustrates a color conversion panel of a display device according to an embodiment of the invention.

An embodiment of a display device according to the invention includes a display panel and a color conversion panel 300, and light emitted from the display panel passes through the color conversion panel to display an image. In FIG. 1, a configuration of a color filter 230 including a light blocking member 220, a first color filter 230R, a second color filter 230G, and a third color filter 230B is schematically illustrated.

Referring to FIG. 1, in such an embodiment, the third color filter 230B is positioned on an entire surface of a substrate except for a first opening 231 overlapping the first color filter 230R and a second opening 232 overlapping the second color filter 230G.

The first color filter 230R is continuously disposed along a first direction DR1, and the second color filter 230G is also continuously disposed along the first direction DR1. The first color filter 230R and the second color filter 230G may partially overlap at edges thereof.

Referring to FIG. 1, an area where the first opening 231 of the third color filter 230B and the first color filter 230R overlap each other will be referred to as a first pixel area PX1, an area where the second opening 232 of the third color filter 230B and the second color filter 230G overlap each other will be referred to as a second pixel area PX2, and a portion marked by dotted lines in FIG. 1 will be referred to as a third pixel area PX3. The pixel area defined in this specification is an area in which the color filter 230 and a color conversion layer (or a transmission layer) overlap each other on the substrate in a vertical direction (or a third direction DR3) and emit light to the outside.

The light blocking member 220 is disposed between the respective pixels. The light blocking member 220 includes a first light blocking member 220a disposed in parallel with the first direction DR1, and a second light blocking member 220b disposed in parallel with a second direction DR2 perpendicular to the first direction DR1. Herein, the third direction DR3, which is perpendicular to a plane defined by the first and second directions DR1 and DR2, may be a thickness direction of the color conversion panel 300 or the display device.

The first light blocking member 220a is positioned between every adjacent pixel areas, but the second light blocking member 220b is positioned only between some adjacent pixel areas. Referring to FIG. 1, in an embodiment, the second light blocking member 220b extends from the first light blocking member 220a disposed between the second pixel area PX2 and the third pixel area PX3, and is disposed in the third direction DR2. In such an embodiment, the second light blocking member 220b may be disposed between second pixel pixels PX2 neighboring each other in the first direction DR1 and between third pixel areas PX3 neighboring each other in the first direction DR1.

A length of the second light blocking member 220b in the second direction DR2 may be shorter than a length in the second direction DR2 of one pixel area. In an embodiment, as shown in FIG. 1, the second light blocking member 220b may be connected with the first light blocking member 220a, but the second light blocking member 220b may be disposed at a distance from the first light blocking member 220a. In an embodiment, as shown in FIG. 1, the second light blocking member 220b may be disposed adjacent to the third pixel area PX3 and the second pixel area PX2, but the second light blocking member 220b may be disposed in various areas. Various embodiments will be described later in detail.

An embodiment of the display device according to the invention includes the second light blocking member 220b disposed in the second direction DR2, and thus a width of the light blocking member 220 may be accurately measured during a manufacturing process, thereby easily managing the process.

In such an embodiment, the second light blocking member 220b is disposed only in some pixels, and is not continuously disposed along the second direction DR2. In such an embodiment, the second light blocking member 220b is disposed on only some pixels among the entire pixels, and the second light blocking member 220b is not disposed on all pixels. As will be described in detail later, the second light blocking member 220b is used as a measurement area for controlling formation of the width of the first light blocking member 220a, and the second light blocking member 220b may be disposed on only 1% to 20% of the entire pixels.

Hereinafter, the color conversion panel 300 of the display device according to an embodiment of the invention will be described in greater detail with a detailed cross-sectional view.

Figure 2:
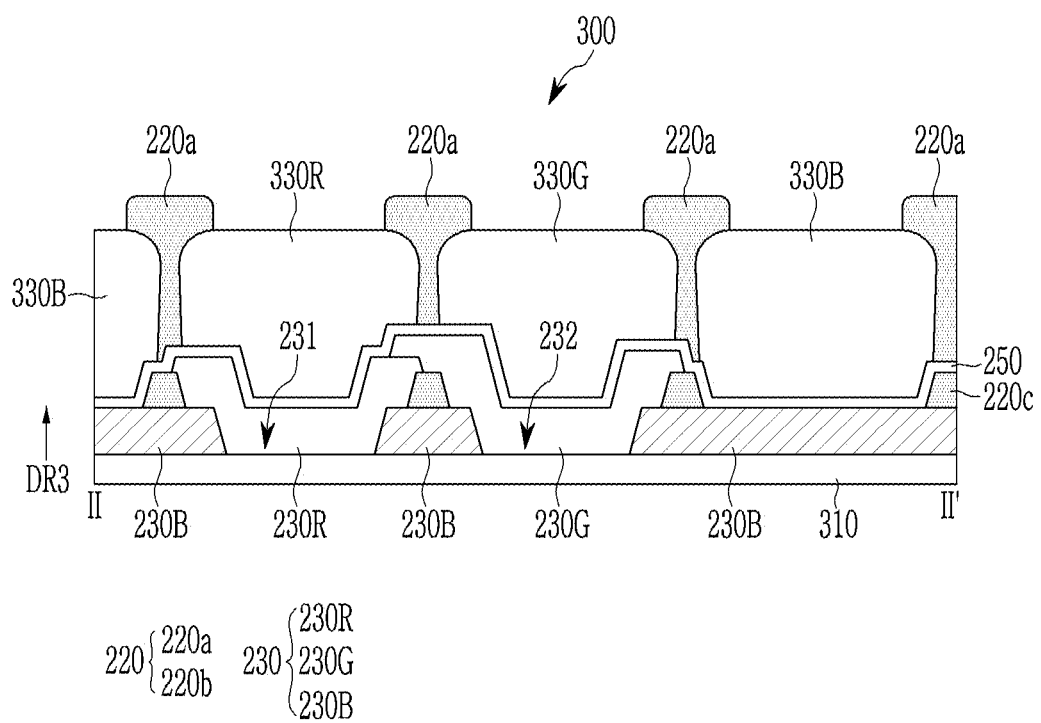
FIG. 2 is a cross-sectional view of FIG. 1, taken along line II-II'.
Figure 3:
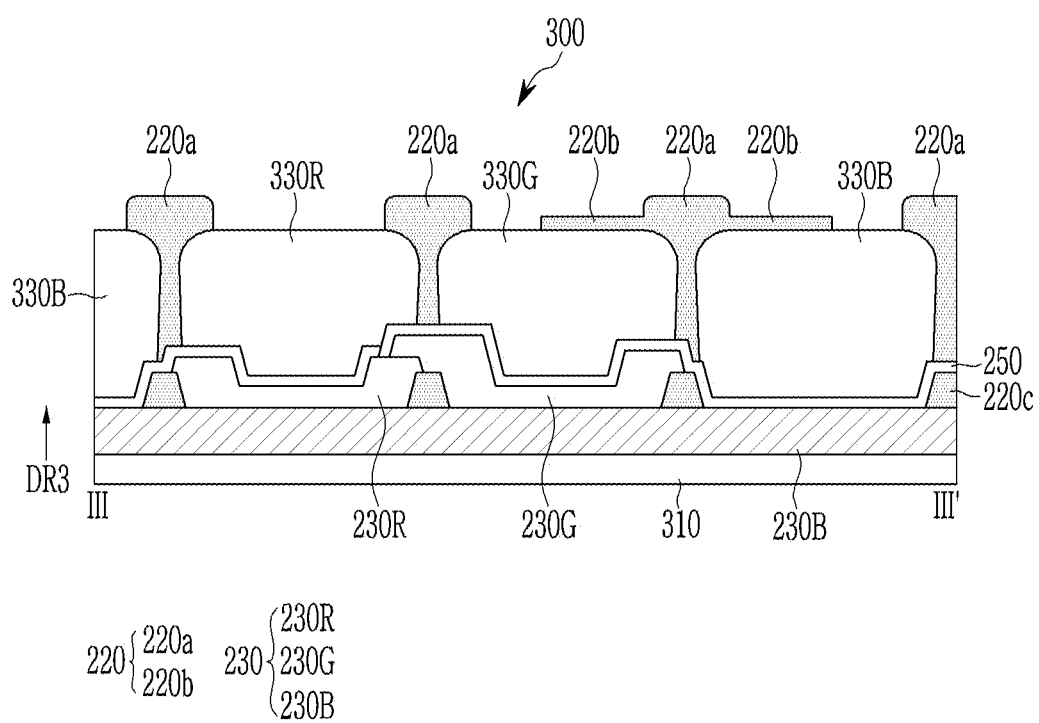
FIG. 3 is a cross-sectional view of FIG. 1, taken along line III-III'.

FIG. 2 is a cross-sectional view of FIG. 1, taken along line II-II'. FIG. 3 is a cross-sectional view of FIG. 1, taken along line III-III'. That is, FIG. 2 is a cross-sectional view taken along a line that overlaps the pixel areas PX1, PX2, and PX3, and FIG. 3 is a cross-sectional view taken along a line that does not overlap the pixel areas PX1, PX2, and PX3.

Hereinafter, an embodiment of the color conversion panel 300 of the display device will be described with reference to FIG. 1 to FIG. 3.

In an embodiment, referring to FIG. 2, the third color filter 230B is disposed on a color conversion substrate 310. The third color filter 230B is disposed on or to cover the entire surface of the substrate except for the first opening 231 and the second opening 232. The color conversion substrate 310 refers to a substrate constituting the color conversion panel 300. The color conversion substrate 310 may include a plastic or a glass.

A third light blocking member 220c is disposed on the third color filter 230B. The third light blocking member 220c is disposed on the third color filter 230B, and reduces reflection of external light by the third color filter 230B.

In such an embodiment, the first color filter 230R is disposed while overlapping the first opening 231. The first color filter 230R may be disposed in or through the first opening 231. The first color filter 230R may be disposed partially overlapping the third color filter 230B and the third light blocking member 220c. In the first opening 231, the first color filter 230R may directly contact the color conversion substrate 310. Referring to FIG. 1, the first color filter 230R may be continuously disposed along the first direction DR1.

In such an embodiment, the second color filter 230G is disposed while overlapping the second opening 232. The second color filter 230G may be disposed in or through the second opening 232. The first color filter 230R may be disposed while partially overlapping the first color filter 230R, the third color filter 230B, and the third light blocking member 220c. In the second opening 232, the second color filter 230G may directly contact the color conversion substrate 310. Referring to FIG. 1, the second color filter 230G may be continuously disposed along the first direction DR1.

The first color filter 230R may be a red color filter, the second color filter 230G may be a green color filter, and the third color filter 230B may be a blue color filter.

As described, in an embodiment of the display device, not the third light blocking member 220c but the first color filter 230R, the second color filter 230G, and the third color filter 230B directly contact the color conversion substrate 310. Therefore, compared to a case having a structure in which the light blocking member is disposed on the color conversion substrate 310 and the color filter is disposed between the light blocking members, the luminous efficiency may be improved.

In such an embodiment, since the third light blocking member 220c is disposed on the third color filter 230B disposed between each color filter, external light reflection may be reduced.

In an embodiment, a blocking film 250 is disposed on the first color filter 230R, the second color filter 230G, and the third color filter 230B.

A first color conversion layer 330R is disposed on the blocking film 250, while overlapping the first color filter 230R. In addition, a second color conversion layer 330G is disposed, while overlapping the second color filter 230G, and a transmission layer 330B is disposed while overlapping the third color filter 230B. In such an embodiment, like the first color filter 230R, the first color conversion layer 330R may be disposed continuously along the first direction DR1. The second color conversion layer 330G and the transmission layer 330B may also be continuously disposed along the first direction DR1.

In an embodiment, the first color conversion layer 330R may convert supplied blue light to red light. In such an embodiment, the first color conversion layer 330R may include a red phosphor, and the red phosphor may be at least one selected from $(Ca, Sr, Ba)S$, $(Ca, Sr, Ba)_2Si_5N_8$, $(CaAlSiN_3)$, $CaMoO_4$, and $Eu_2Si_5N_8$. In an embodiment, the first color conversion layer 330R may include quantum dots. The quantum dots may convert incident blue light to red light.

The second color conversion layer 330G may convert supplied blue light to green light. The second color conversion layer 330G may include a green phosphor, and the green phosphor may be at least one selected from yttrium aluminum garnet (YAG), (Ca, Sr, Ba)$_2$, SiO$_4$, SrGa$_2$S$_4$, BAM, α-SiAlON, β-SiAlON, Ca$_3$Sc$_2$Si$_3$O$_{12}$, Tb$_3$Al$_5$O$_{12}$, BaSiO$_4$, CaAlSiON, and (Sr$_{1-x}$Ba$_x$)Si$_2$O$_2$N$_2$. Here, x may be an arbitrary number between 0 and 1. In an embodiment, the second color conversion layer 330G may include quantum dots. The quantum dots may convert incident blue light to green light.

The transmission layer 330B transmits incident blue light. The transmission layer may include a transparent polymer, and supplied blue light is transmitted therethrough and a blue color is displayed. The transmission layer 330B corresponding to the blue emission region includes a material that emits incident blue without a separate phosphor or quantum dot, and may include a scattering body.

The light blocking member 220 is disposed between the first color conversion layer 330R, the second color conversion layer 330G, and the transmission layer 330B. In an embodiment, as shown in FIG. 1, the light blocking member 220 may include the first light blocking member 220a disposed in the first direction DR1 and the second light blocking member 220b disposed in the second direction DR2.

FIG. 2 illustrates a cross-section including the first light blocking members 220a. Referring to FIG. 2, first light blocking members 220a are disposed while filling spaces between the first color conversion layer 330R, the second color conversion layer 330G, and the transmission layer 330B spaced apart from each other.

In an embodiment of the manufacturing process of the first color conversion layer 330R, the second color conversion layer 330G, and the transmission layer 330B, a separation space is provided or formed between each color conversion layer and the transmission layer, and the space is filled with the first light blocking member 220a.

In such an embodiment where the first light blocking member 220a is formed by filling the empty space, the first light blocking member 220a may not have a uniform width. That is, the width of the first light blocking member 220a may be changed when the separation space between each of the color conversion layers 330R and 330G and the transmission layer 330B is changed.

Thus, it is desired to uniformly control and manage the width of the light blocking member 220 in the process. When the width of the light blocking member 220 is not properly controlled, color mixing may occur between neighboring color conversion layers or transmission layers. However, as shown in FIG. 2, the width of the first light blocking member 220a may be changed due to the separation space between the color conversion layer and the transmission layer, and thus it is difficult to properly control the width of the light blocking member 220 during the process by using the method for measuring the width of the first light blocking member 220a.

In an embodiment of the display device, the second light blocking member 220b is located in a non-display area rather than between the neighboring color conversion layers 330R and 330G and the transmission layer 330B. Therefore, the width of the light blocking member may be controlled by measuring the width of the second light blocking member 220b formed with a constant width.

FIG. 3 is a cross-sectional view of FIG. 1, taken along line III-III'. Referring to FIG. 3, the color conversion substrate 310 and the third color filter 230B contact each other. The third light blocking member 220c is disposed on the third color filter 230B, and the first color filter 230R and the second color filter 230G are respectively disposed between neighboring third light blocking members 220c.

FIG. 3 shows a cross-section of the non-display area, not a pixel area. Referring to FIG. 3, the second light blocking member 220b is disposed while overlapping the second color conversion layer 330G and the transmission layer 330B.

In such an embodiment, as shown in FIG. 1, the first light blocking member 220a disposed between the second color conversion layer 330G and the transmission layer 330B includes the second light blocking member 220b extending in the second direction DR2 in the non-display area. The second light blocking member 220b overlaps the second color conversion layer 330G and the transmission layer 330B, respectively, in a direction that is perpendicular to the color conversion substrate 310 or the third direction DR3. A width of the light blocking member may be controlled by measuring a width of the second light blocking member 220b during the process. As shown in FIG. 1 and FIG. 2, the first light blocking member 220a may have a non-uniform width because the first light blocking member 220a may be formed while filling the separation space between adjacent color conversion layers or transmission layer. In an embodiment, as shown in FIG. 1 and FIG. 3, the second light blocking member 220b is formed with a constant width because the second light blocking member 220b is disposed on one color conversion layer 330G or the transmission layer 330B, and accordingly, the width of the second light blocking member 220b may be controlled by being measured during the process.

Herein, the width implies a width measured in a direction that is perpendicular to a length direction. That is, referring to FIG. 1, the width of the first light blocking member 220a is a width of the first light blocking member 220a measured in the second direction DR2, and the width of the second light blocking member 220b is a width of the second light blocking member 220b measured in the first direction DR1.

Figure 4:
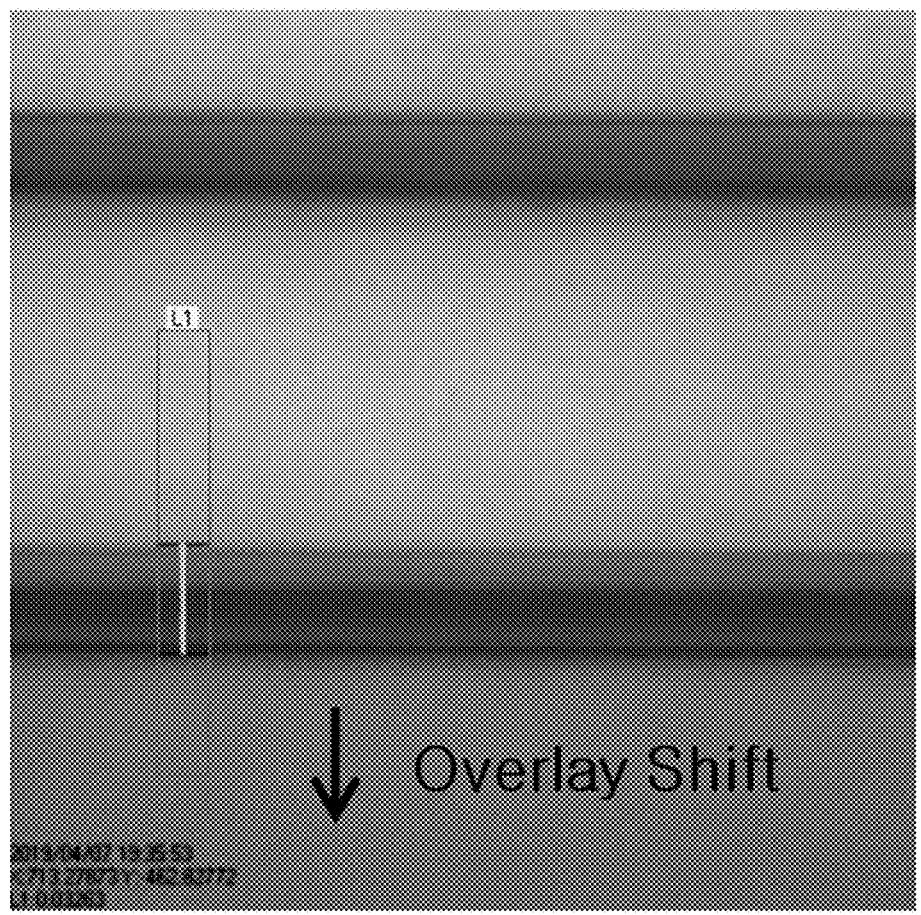
FIG. 4 and FIG. 5 are photographs showing an area of the display device of FIG. 1.
Figure 5:
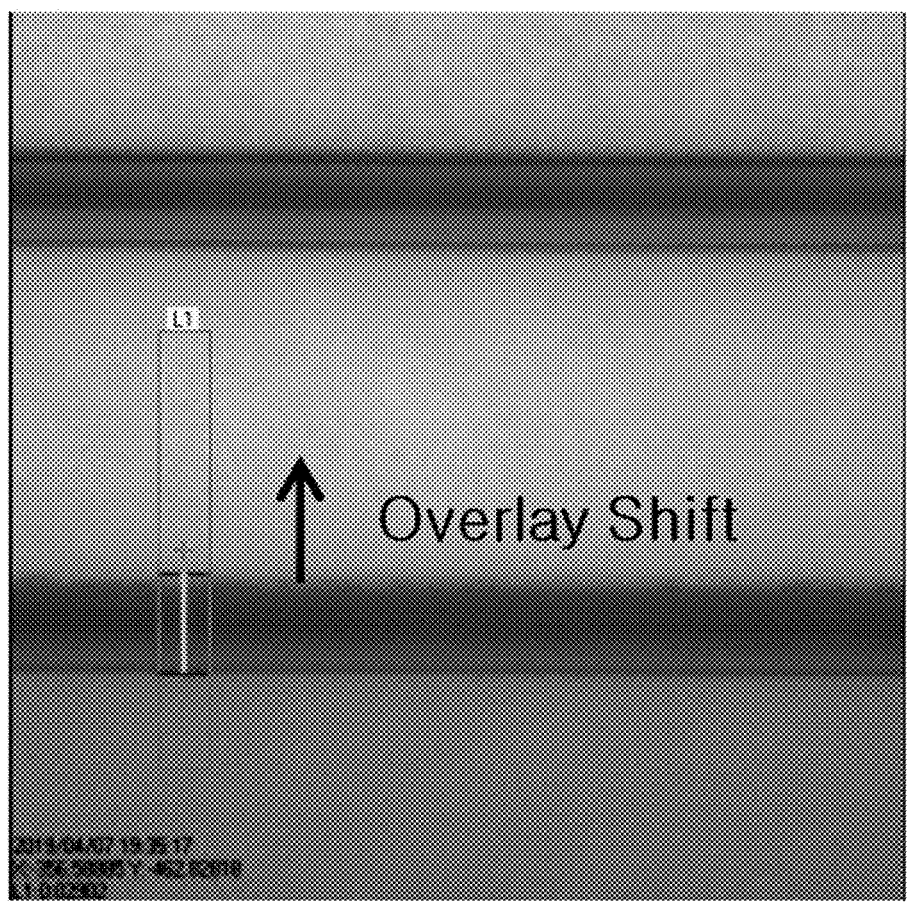

FIG. 4 and FIG. 5 are photographs showing an area of the display device of FIG. 1. In FIG. 4 and FIG. 5, the parts marked in a dark color are areas corresponding to the first light blocking members 220a. Referring to FIG. 4 and FIG. 5, it can be determined that the width of the first light blocking member 220a is not the same as that of the other first light blocking member 220a in parallel. That is, the light blocking member may be shifted during the formation process, and thus it is not desirable to control the formation of the light blocking member by measuring the width of the first light blocking member 220a.

An embodiment of the display device includes a second light blocking member 220b disposed on one color conversion layer or one transmission layer, not between neighboring color conversion layers or transmission layers, and thus the formation of the light blocking member may be controlled by measuring the width of the second light blocking member 220b.

As described above, the width of the light blocking member implies a width that is perpendicular to a length direction. That is, the width of the first light blocking member 220a is a width in the second direction DR2, and the width of the second light blocking member 220b is a width in the first direction DR1. In an embodiment, the second light blocking member 220b is a means for measuring the width of the first light blocking member 220a, and the width of the first light blocking member 220a and the width of the second light blocking member 220b may be the same as each other.

Herein, the meaning of "substantially equivalent/equal/ the same" means that a difference is less than 10% when considering the process distribution and the like. That is, when a difference between the width of the first light blocking member 220a in the second direction DR2 and the width of the first light blocking member 220b in the first direction DR1 is less than 10%, it is assumed that the width of the first light blocking member 220a and the width of the second light blocking member 220b are substantially the same as each other.

Next, an embodiment of a display device including the color conversion panel 300 will be described in detail with reference to the accompanying drawings.

Figure 6:
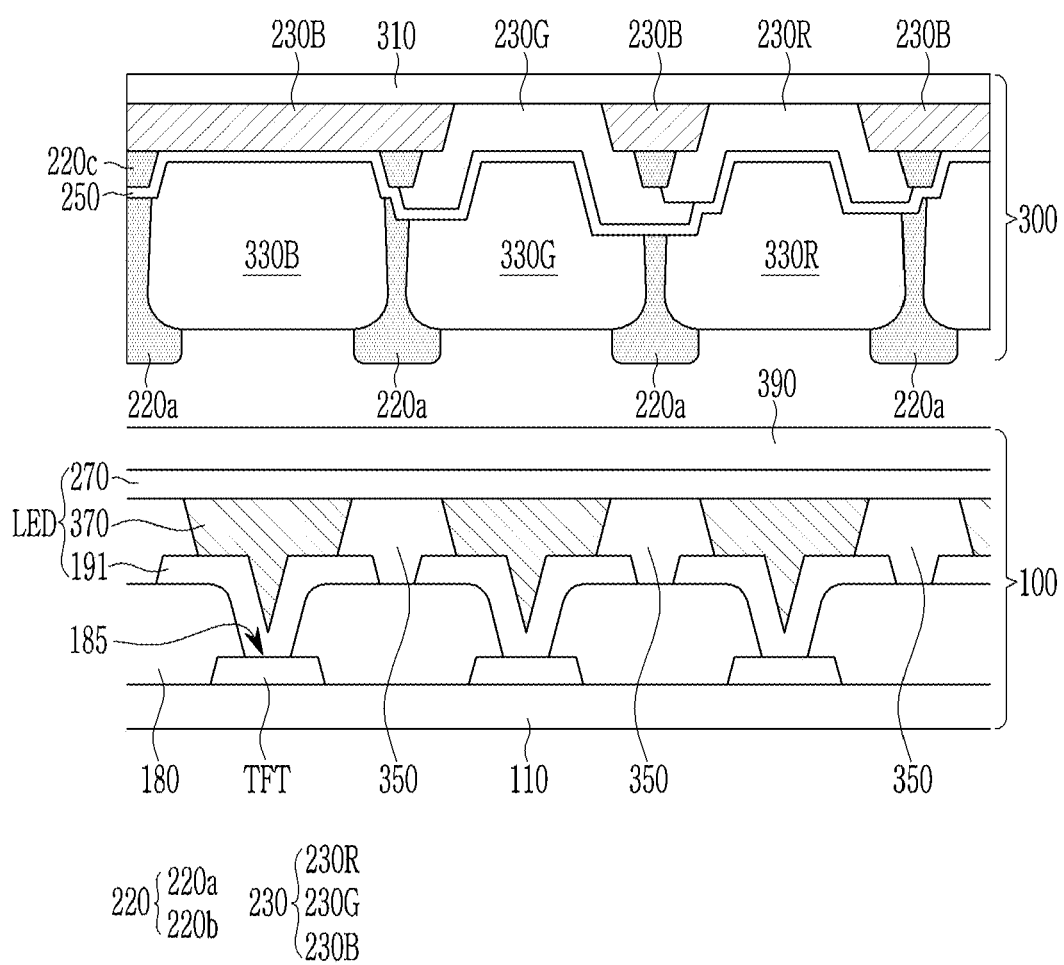
FIG. 6 schematically illustrates a cross-section of a display device according to an embodiment of the invention.

FIG. 6 schematically illustrates a cross-section of a display device according to an embodiment of the invention.

Referring to FIG. 6, an embodiment of a display device includes the color conversion panel 300 and a display panel 100. In such an embodiment, the color conversion panel 300 may be substantially the same as the embodiments of the color conversion panel described above with reference to FIGS. 1 to 5.

In an embodiment, the display panel 100 includes a display substrate 110. A transistor TFT and a first electrode 191 connected to the transistor TFT are disposed on the display substrate 110, and an insulation film 180 is disposed between the first electrode 191 and the display substrate 110.

The first electrode 191 is connected with the transistor TFT through an opening 185 of the insulation film 180. Referring to FIG. 6, a partitioning wall 350 with an opening is disposed in the first electrode 191, and a second electrode 270 is disposed in the partitioning wall 350. A light emitting element layer 370 is disposed in the opening of the partitioning wall 350. The light emitting element layer 370 emits light based on a voltage applied to the first electrode 191 and the second electrode 270.

The light emitting element layer 370 emits blue light. The blue light emitted from each light emitting element layer 370 is converted into red light or green light while passing through color conversion layers 330R and 330G, or transmitted as the blue color in the transmission layer 330B.

The first electrode 191, the second electrode 270, and the light emitting element layer 370 collectively define or form a light emitting diode LED.

An encapsulation layer 390 may be disposed on the second electrode 270. The encapsulation layer 390 may have a multi-layer structure including an inorganic layer and an organic layer.

In an embodiment, the configuration of the transistor TFT and the light emitting diode (LED) is not limited to that schematically illustrated in FIG. 6, but may include various other transistors ("TFT"s).

In such an embodiment, as noted above, the color conversion panel 300 is substantially the same as that described above with reference to FIG. 1 to FIG. 3, and any repetitive detailed description thereof will be omitted.

In an embodiment of the display device, the blue light emitted from the light emitting diode LED of the display panel 100 passes through the color conversion layers 330R and 330G of the color conversion panel 300, and is converted to red light, green light, or transmitted as blue light at the transmission layer 330B such that a color image is displayed.

Figure 7:
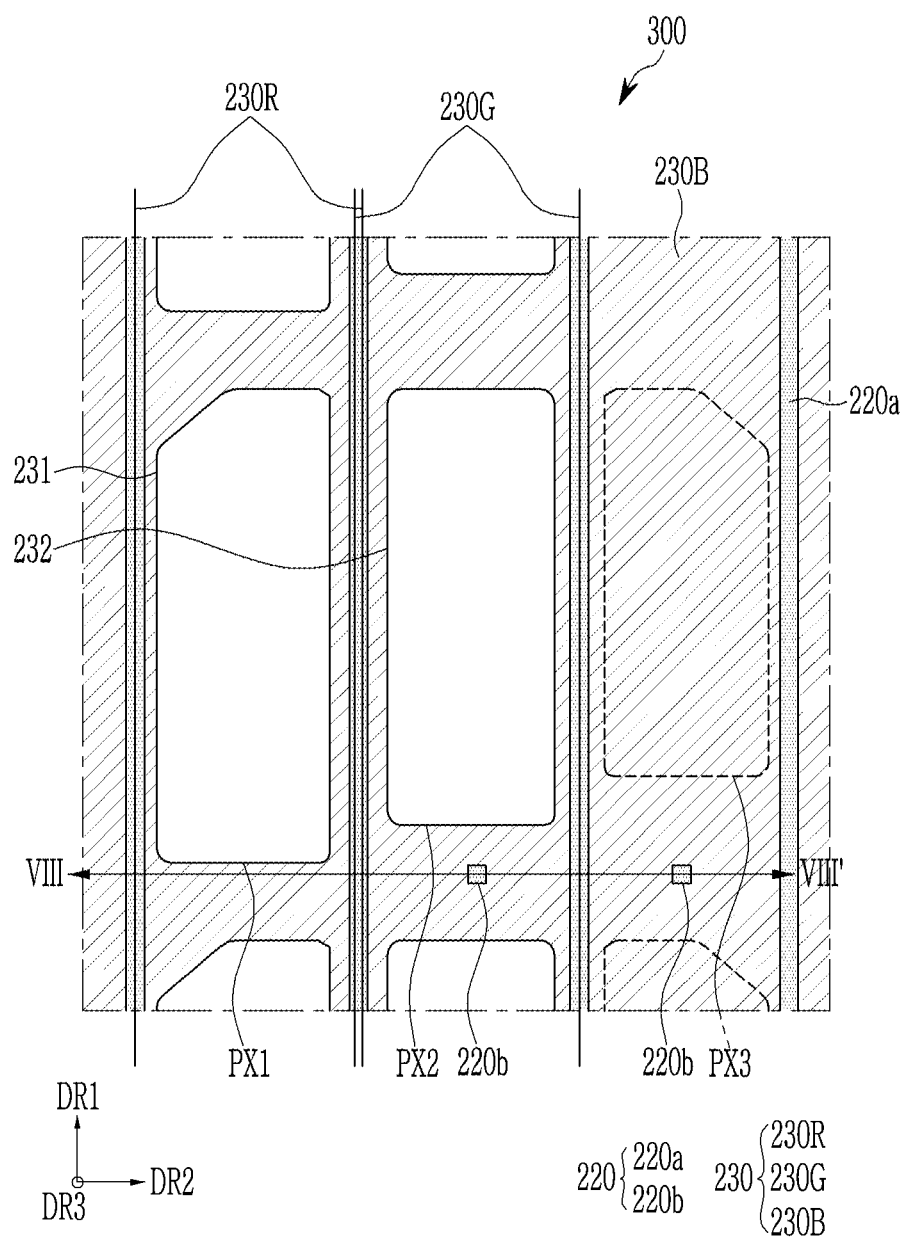
FIG. 7 is a top plan view of a color conversion panel of a display device according to an alternative embodiment.
Figure 8:
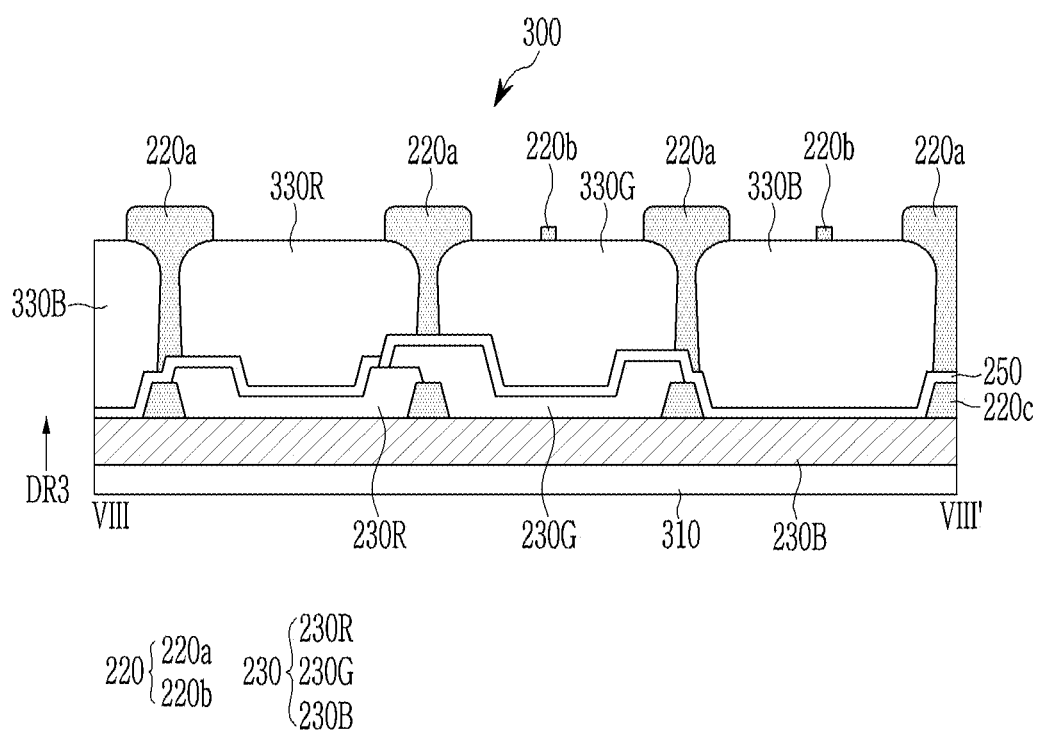
FIG. 8 is a cross-sectional view of FIG. 7, taken along line VIII-VIII'.

FIG. 7 is a top plan view of a color conversion panel of a display device according to an alternative embodiment. FIG. 8 is a cross-sectional view of FIG. 7, taken along line VIII-VIII'.

An embodiment of the color conversion panel shown in FIGS. 7 and 8 is substantially the same as the embodiment of FIG. 1, except that a second light blocking member 220b is an island type that is separated from a first light blocking member 220a. The same or like elements shown in FIGS. 7 and 8 have been labeled with the same reference characters as used above to describe the embodiments of the color conversion panel shown in FIG. 3, and any repetitive detailed description thereof will be omitted or simplified.

In an embodiment, as shown in FIG. 7 and FIG. 8, the second light blocking member 220b is formed as a dot-shaped island, and a formation process of the light blocking member may be controlled by measuring a width of the second light blocking member 220b.

In such an embodiment, where the second light blocking member 220b is provided as the dot shape, a formation process of other structures may be controlled by measuring a distance between separated second light blocking members 220b.

In one embodiment, for example, as shown in FIG. 7 and FIG. 8, a distance between the second light blocking member 220b disposed on a second color conversion layer 330G and a second light blocking member 220b disposed on another neighboring second color conversion layer 330G (not shown) is measured to determine whether each of the color conversion layers and transmission layers is formed with an appropriate width.

In such an embodiment, a distance between the second light blocking member 220b disposed on a second color conversion layer 330G and a second light blocking member 220b disposed on the transmission layer 330B is measured to determine whether each of the color conversion layers and transmission layers is formed with an appropriate width.

Figure 9:
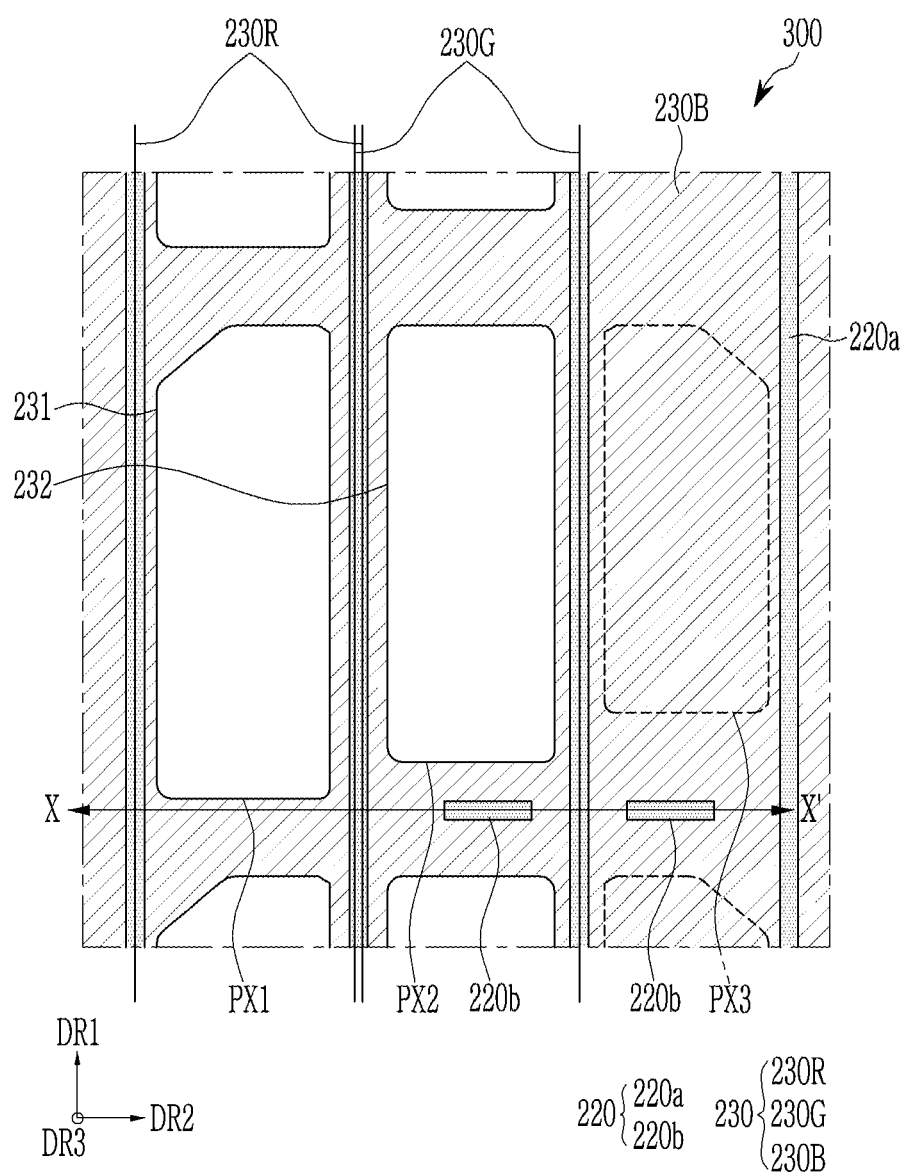
FIG. 9 is a top plan view of a color conversion panel of a display device according to an alternative embodiment.
Figure 10:
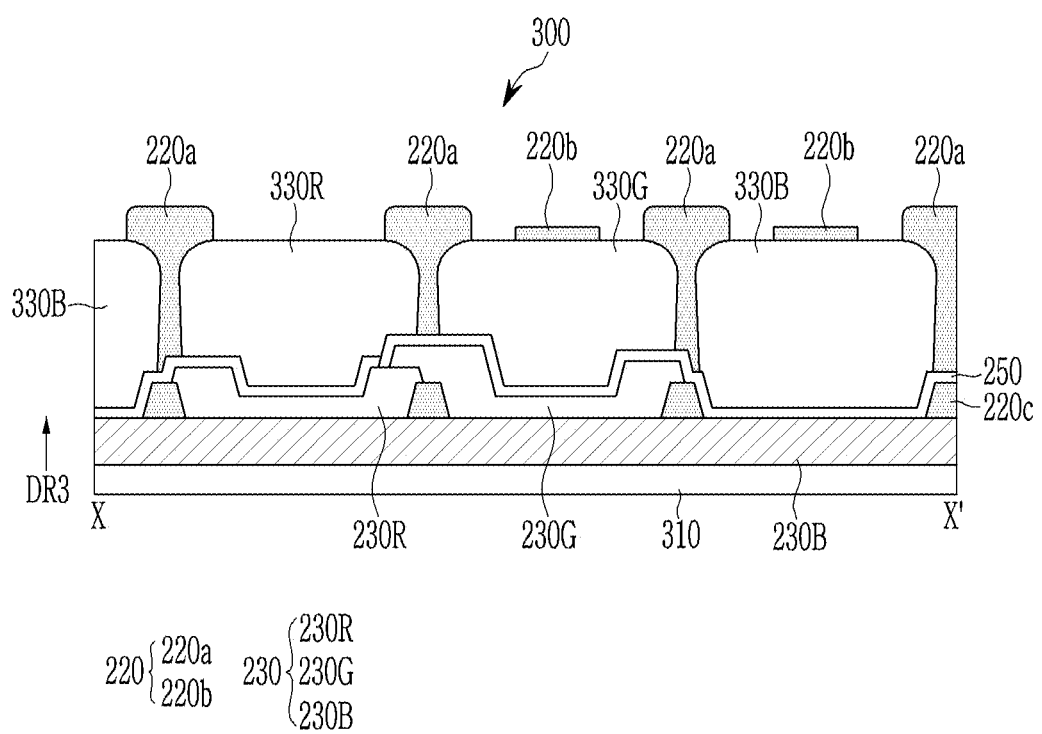
FIG. 10 is a cross-sectional view of FIG. 9, taken along line X-X'.

FIG. 9 is a top plan view of a color conversion panel of a display device according to another alternative embodiment. FIG. 10 is a cross-sectional view of FIG. 9, taken along line X-X'.

An embodiment of a color conversion panel shown in FIGS. 9 and 10 is substantially the same as the embodiment of FIG. 7, except that a second light blocking member 220b is in a bar shape having a length in a second direction DR2. The same or like elements shown in FIGS. 9 and 10 have been labeled with the same reference characters as used above to describe the embodiments of the color conversion panel shown in FIG. 7, and any repetitive detailed description thereof will be omitted or simplified.

In such an embodiment where the second light blocking member 220b has a bar shape, process stability increases when the second light blocking member 220b is formed, and thus the width of the second light blocking member 220b may be stably measured.

Figure 11:
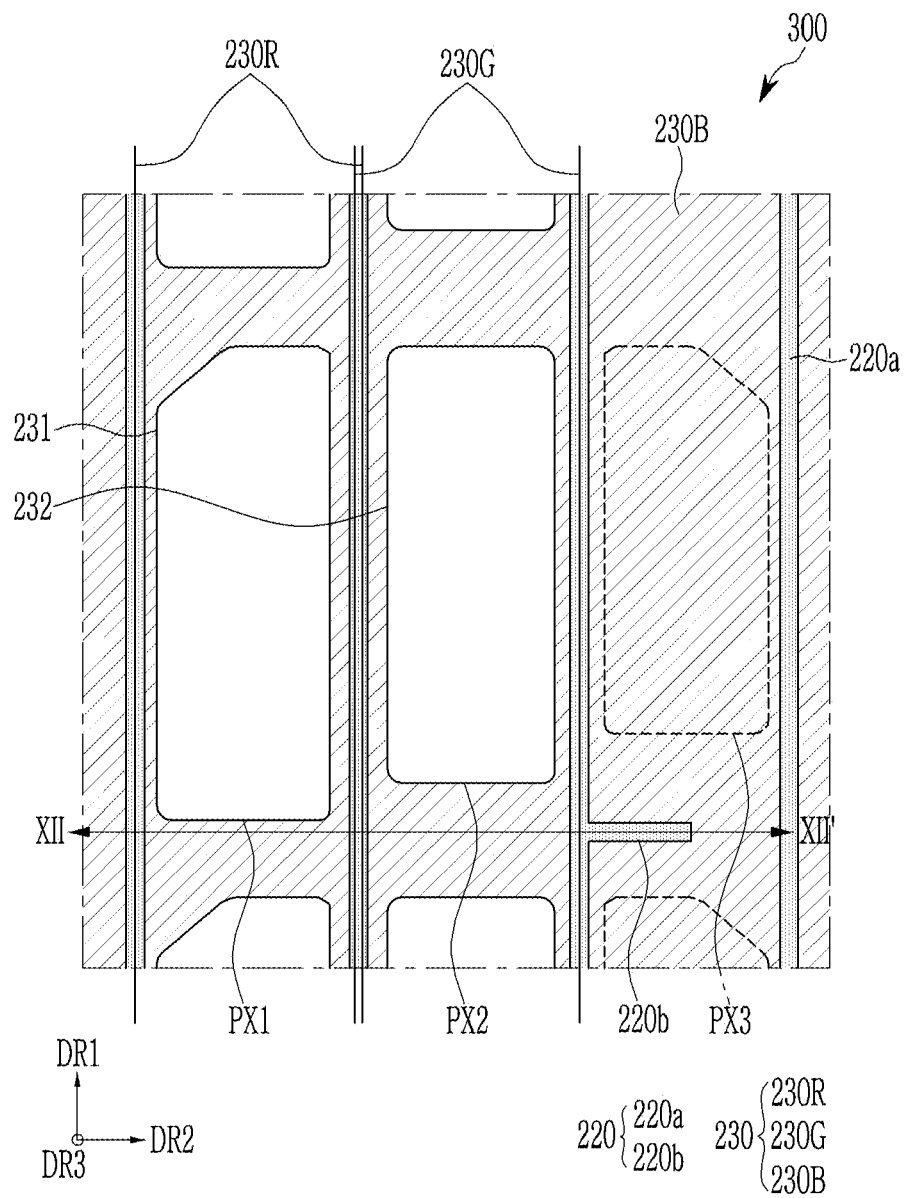
FIG. 11 is a top plan view of a color conversion panel of a display device according to an alternative embodiment.
Figure 12:
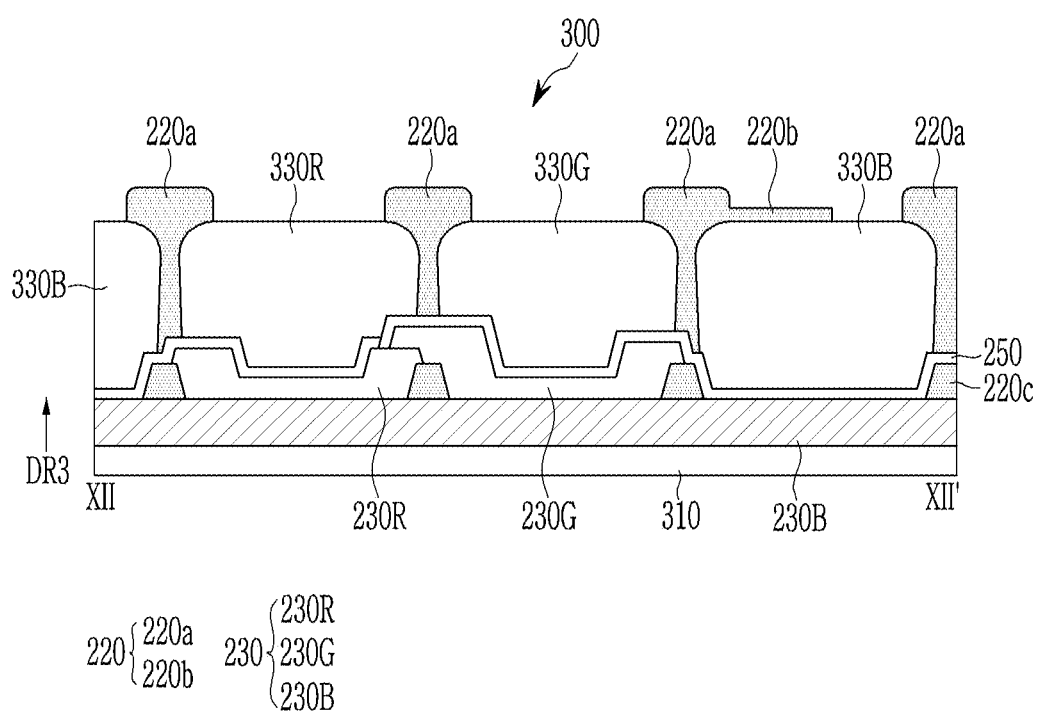
FIG. 12 is a cross-sectional view of FIG. 11, taken along line XII-XII'.

FIG. 11 is a top plan view of a color conversion panel of a display device according to another alternative embodiment. FIG. 12 is a cross-sectional view of FIG. 11, taken along line XII-XII'.

An embodiment of a color conversion panel of a display device shown in FIGS. 11 and 12 is substantially the same as the embodiment of FIG. 1, except that a second light blocking member 220b is disposed only on a transmission layer 330B. The same or like elements shown in FIGS. 11 and 12 have been labeled with the same reference characters as used above to describe the embodiments of the color conversion panel shown in FIG. 1, and any repetitive detailed description thereof will be omitted or simplified.

In such an embodiment, the second light blocking member 220b may be disposed only on the transmission layer 330B, and may not be disposed on a first color conversion layer 330R and a second color conversion layer 330G. In such an embodiment where the second light blocking member 220b is disposed only on the transmission layer 330B, the formation process of the light blocking member may be controlled by measuring a width of the second light blocking member 220b. The top surface of the transmission layer 330B may have a uniform height because only a third color filter 230B is disposed on the bottom surface of the transmission layer 330B. Thus, the second light blocking member 220 on the transmission layer 330B may have a uniform width, and the width of the second light blocking member 220b may be accurately measured.

Figure 13:
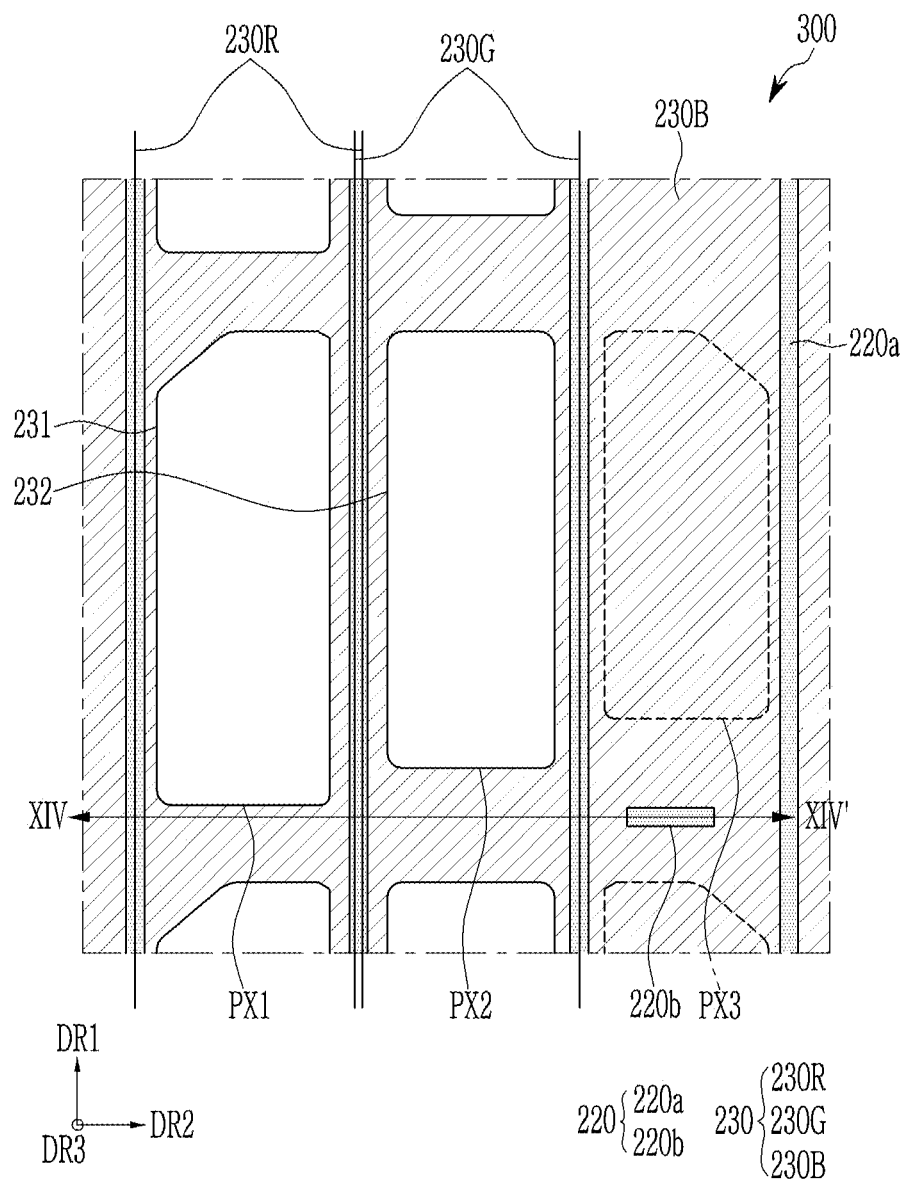
FIG. 13 is a top plan view of a color conversion panel of a display device according to an alternative embodiment.
Figure 14:
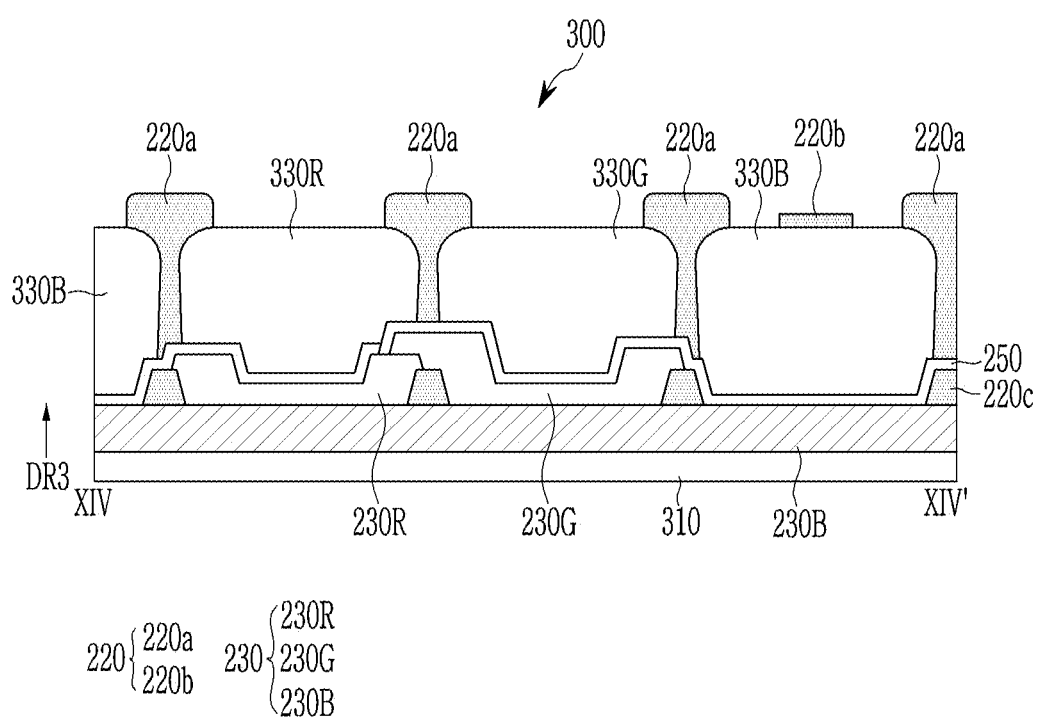
FIG. 14 is a cross-sectional view of FIG. 13, taken along line XIV-XIV.

FIG. 13 is a top plan view of a color conversion panel of a display device according to another alternative embodiment. FIG. 14 is a cross-sectional view of FIG. 13, taken along line XIV-XIV.

An embodiment of a color conversion panel of a display device shown in FIGS. 13 and 14 is substantially the same as the embodiment of FIG. 1, except that a second light blocking member 220b and a first light blocking member 220a are separated from each other. The same or like elements shown in FIGS. 13 and 14 have been labeled with the same reference characters as used above to describe the embodiments of the color conversion panel shown in FIG. 1, and any repetitive detailed description thereof will be omitted.

Figure 15:
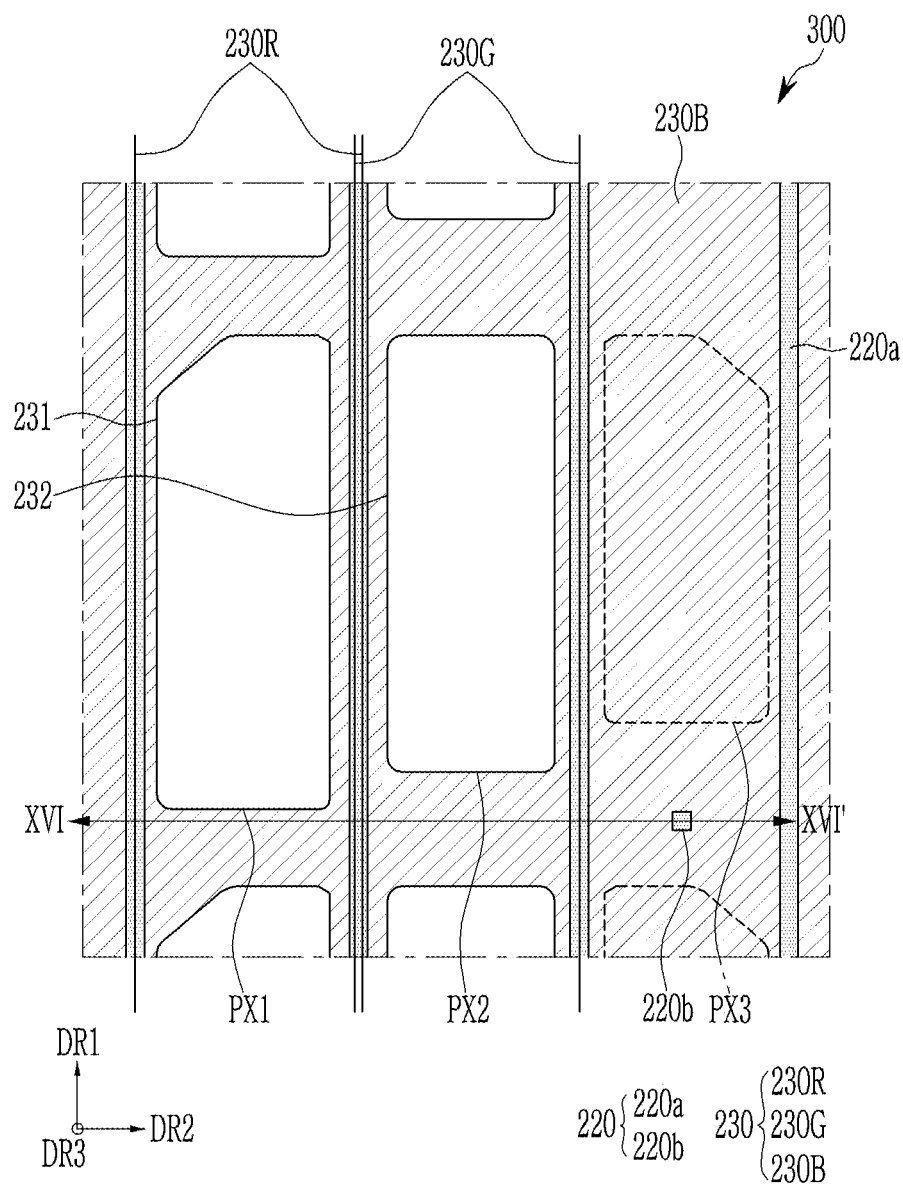
FIG. 15 is a top plan view of a color conversion panel of a display device according to an alternative embodiment.
Figure 16:
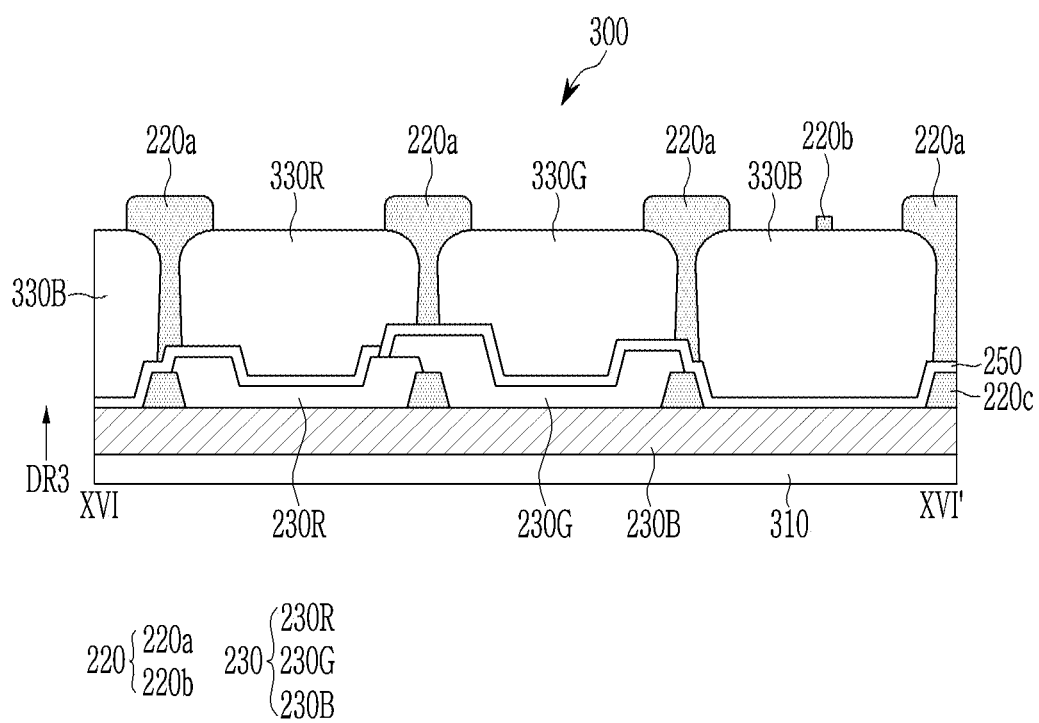
FIG. 16 is a cross-sectional view of FIG. 15, taken along line XVI-XVI'.

FIG. 15 is a top plan view of a color conversion panel of a display device according to another alternative embodiment. FIG. 16 is a cross-sectional view of FIG. 15, taken along line XVI-XVI'.

An embodiment of a color conversion panel of a display device shown in FIGS. 15 and 16 is substantially the same as the embodiment of FIG. 13 and FIG. 14, except that a second light blocking member 220b is separated from a first light blocking member 220a, and is formed in the shape of a dot. The same or like elements shown in FIGS. 9 and 10 have been labeled with the same reference characters as used above to describe the embodiments of the color conversion panel shown in FIG. 7, and any repetitive detailed description thereof will be omitted.

Figure 17:
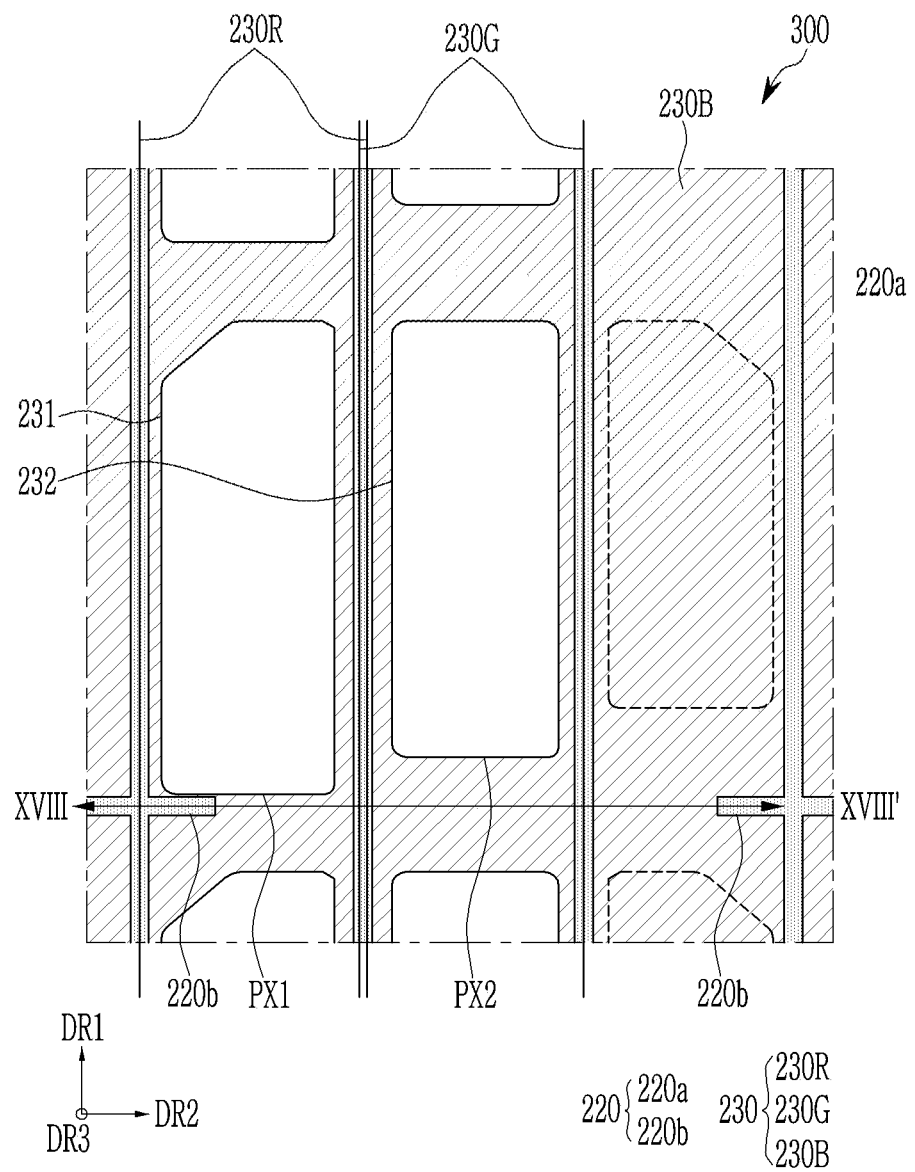
FIG. 17 is a top plan view of a color conversion panel of a display device according to an alternative embodiment.
Figure 18:
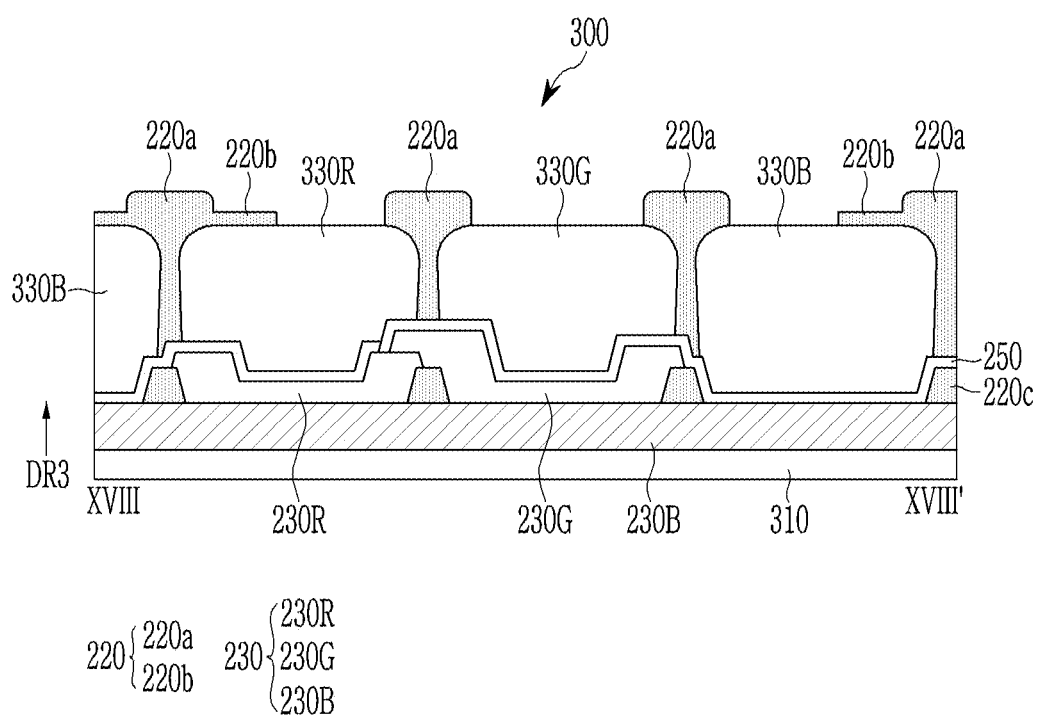
FIG. 18 is a cross-sectional view of FIG. 17, taken along line XVIII-XVIII'.

FIG. 17 is a top plan view of a color conversion panel of a display device according to another alternative embodiment. FIG. 18 is a cross-sectional view of FIG. 17, taken along line XVIII-XVIII'.

An embodiment of a color conversion panel of a display device shown in FIGS. 17 and 18 is substantially the same as the embodiment of FIG. 1, except that a second light blocking member 220b is disposed on a transmission layer 330B and a first color conversion layer 330R. The same or like elements shown in FIGS. 17 and 18 have been labeled with the same reference characters as used above to describe the embodiments of the color conversion panel shown in FIG. 1, and any repetitive detailed description thereof will be omitted or simplified.

In an embodiment shown in FIG. 1, the second light blocking member 220b is disposed on the transmission layer 330B and the second color conversion layer 330G. In an alternative embodiment, as shown in FIG. 17 and FIG. 18, the second light blocking member 220b is disposed on the transmission layer 330B and the first color conversion layer 330R.

Figure 19:
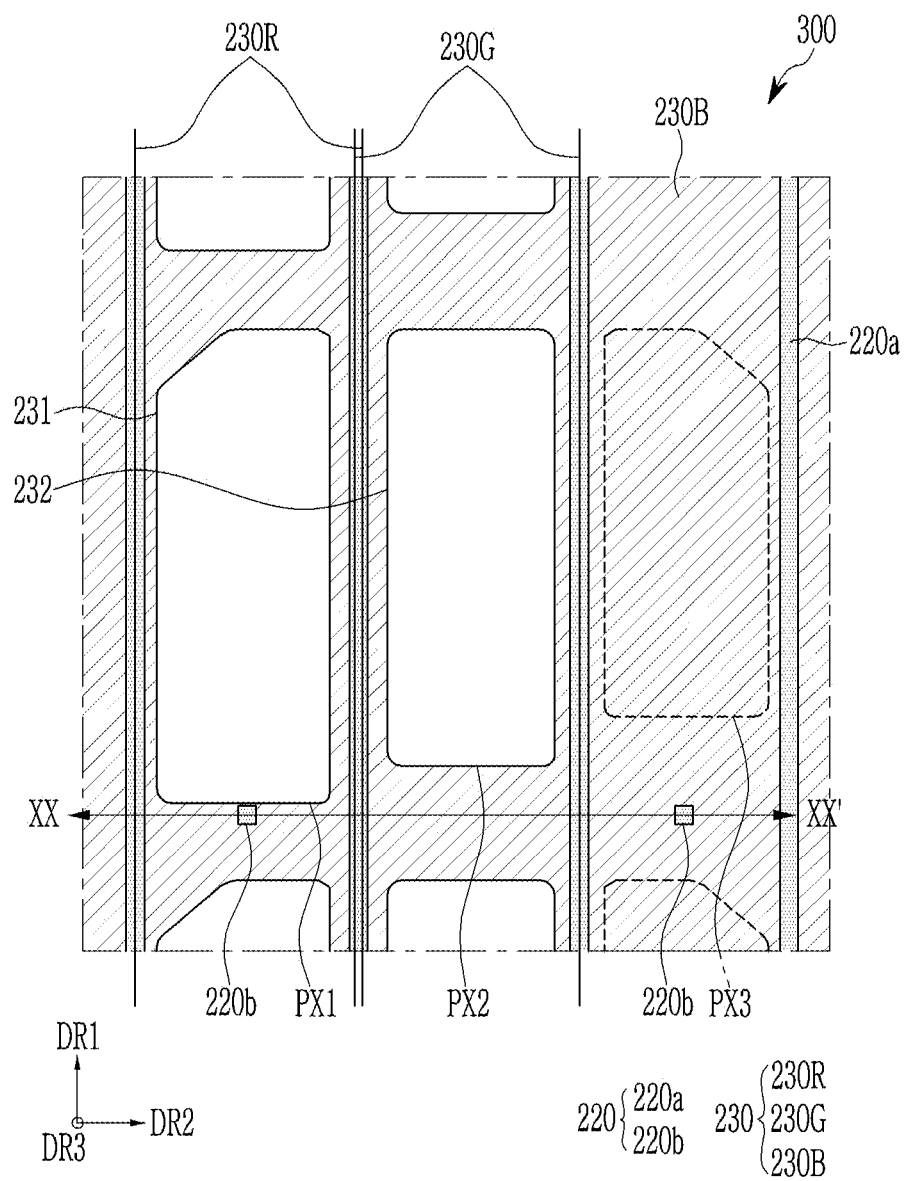
FIG. 19 is a top plan view of a color conversion panel of a display device according to an alternative embodiment.
Figure 20:
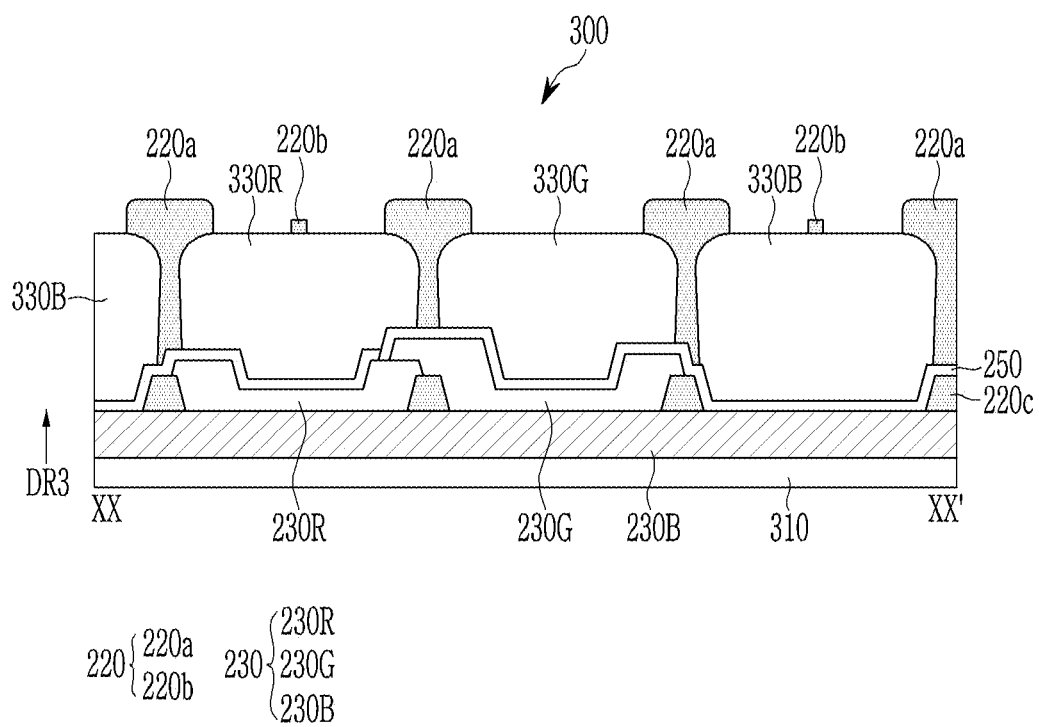
FIG. 20 is a cross-sectional view of FIG. 19, taken along line XX-XX'.

FIG. 19 is a top plan view of a color conversion panel of a display device according to another alternative embodiment. FIG. 20 is a cross-sectional view of FIG. 19, taken along line XX-XX'.

An embodiment of a color conversion panel of a display device shown in FIGS. 19 and 20 is substantially the same as the embodiment of FIG. 7, except that a second light blocking member 220b is disposed on a transmission layer 330B and a first color conversion layer 330R. The same or like elements shown in FIGS. 9 and 10 have been labeled with the same reference characters as used above to describe the embodiments of the color conversion panel shown in FIG. 7, and any repetitive detailed description thereof will be omitted or simplified.

In an embodiment of FIG. 7, the second light blocking member 220b is disposed on the transmission layer 330B and the color conversion layer 330G. In an alternative embodiment, the second light blocking member 220b is disposed on the transmission layer 330B and the first color conversion layer 330R as shown in FIG. 19 and FIG. 20.

Figure 21:
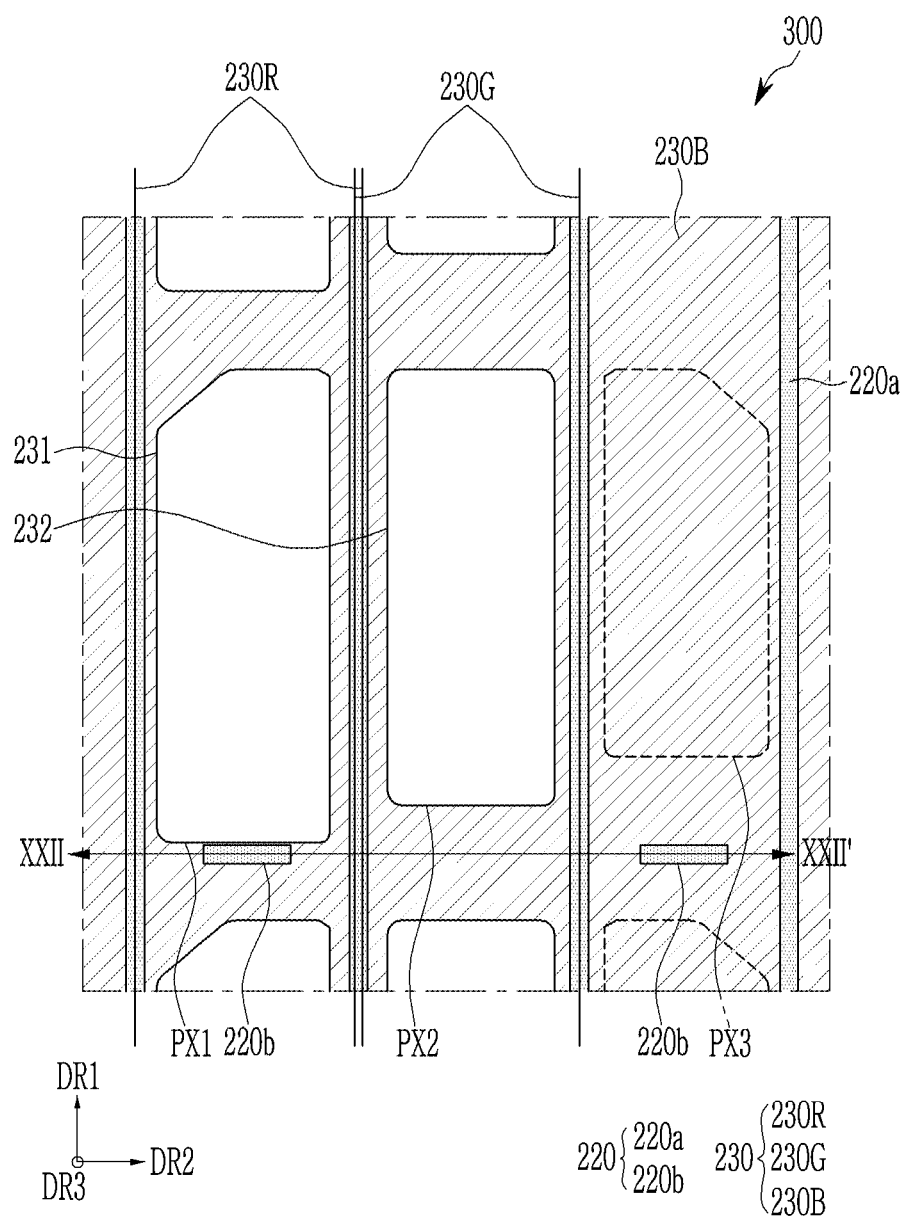
FIG. 21 is a top plan view of a color conversion panel of a display device according to an alternative embodiment.
Figure 22:
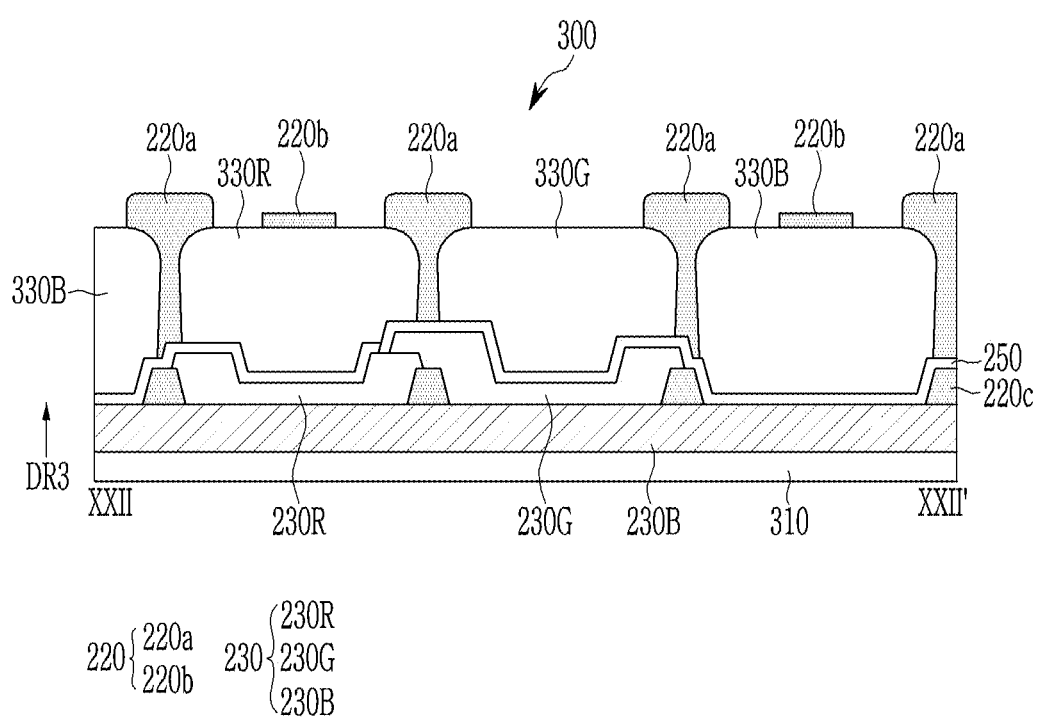
FIG. 22 is a cross-sectional view of FIG. 21, taken along line XXII-XXII'.

FIG. 21 is a top plan view of a color conversion panel of a display device according to another alternative embodiment. FIG. 22 is a cross-sectional view of FIG. 21, taken along line XXII-XXII'.

An embodiment of a color conversion panel of a display device shown in FIGS. 21 and 22 is substantially the same as the embodiment of FIG. 9, except that a second light blocking member 220b is disposed on a transmission layer 330B and a first color conversion layer 330R. The same or like elements shown in FIGS. 9 and 10 have been labeled with the same reference characters as used above to describe the embodiments of the color conversion panel shown in FIG. 7, and any repetitive detailed description thereof will be omitted or simplified.

In an embodiment of FIG. 9, the second light blocking member 220b is disposed on the transmission layer 330B and the second color conversion layer 330G. In an alternative embodiment, the second light blocking member 220b is disposed on the transmission layer 330B and the first color conversion layer 330R as shown in FIG. 21 and FIG. 22.

Figure 23:
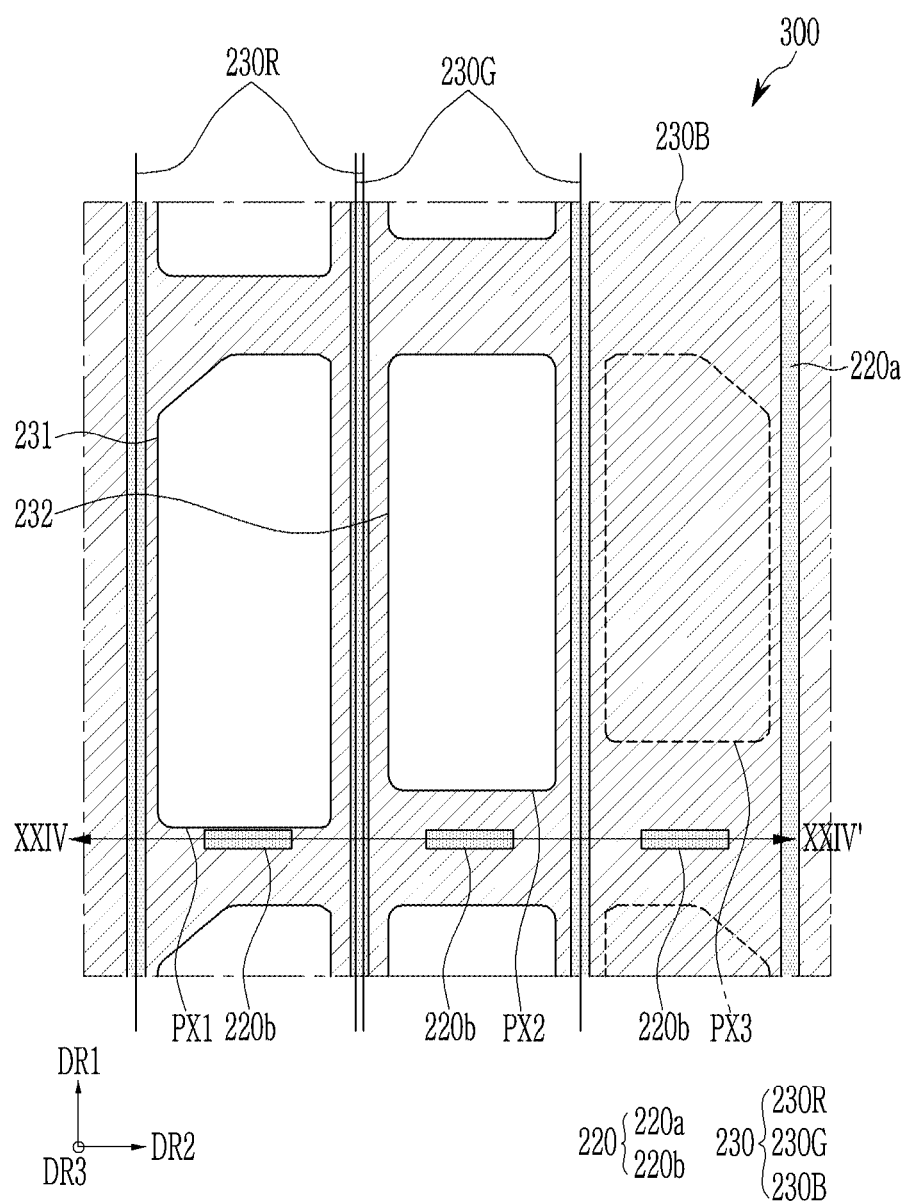
FIG. 23 is a top plan view of a color conversion panel of a display device according to an alternative embodiment.
Figure 24:
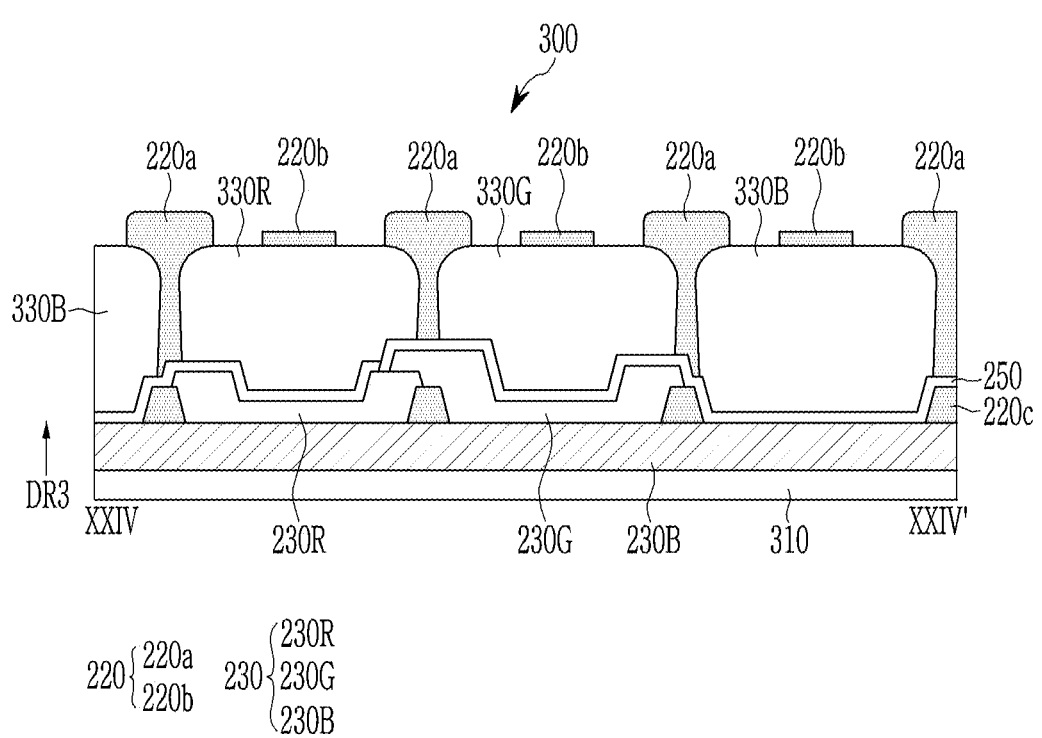
FIG. 24 is a cross-sectional view of FIG. 23, taken along line XXIV-XXIV'.

FIG. 23 is a top plan view of a color conversion panel of a display device according to another alternative embodiment. FIG. 24 is a cross-sectional view of FIG. 23, taken along line XXIV-XXIV'.

An embodiment of a color conversion panel of a display device shown in FIGS. 23 and 24 is substantially the same as the embodiment of FIG. 9, except that a second light blocking member 220b is disposed on a transmission layer 330B, a first color conversion layer 330R, and a second color conversion layer 330G.

In such an embodiment, the second light blocking member 220b is disposed in many more areas than that in the embodiment of FIG. 9.

Figure 25:
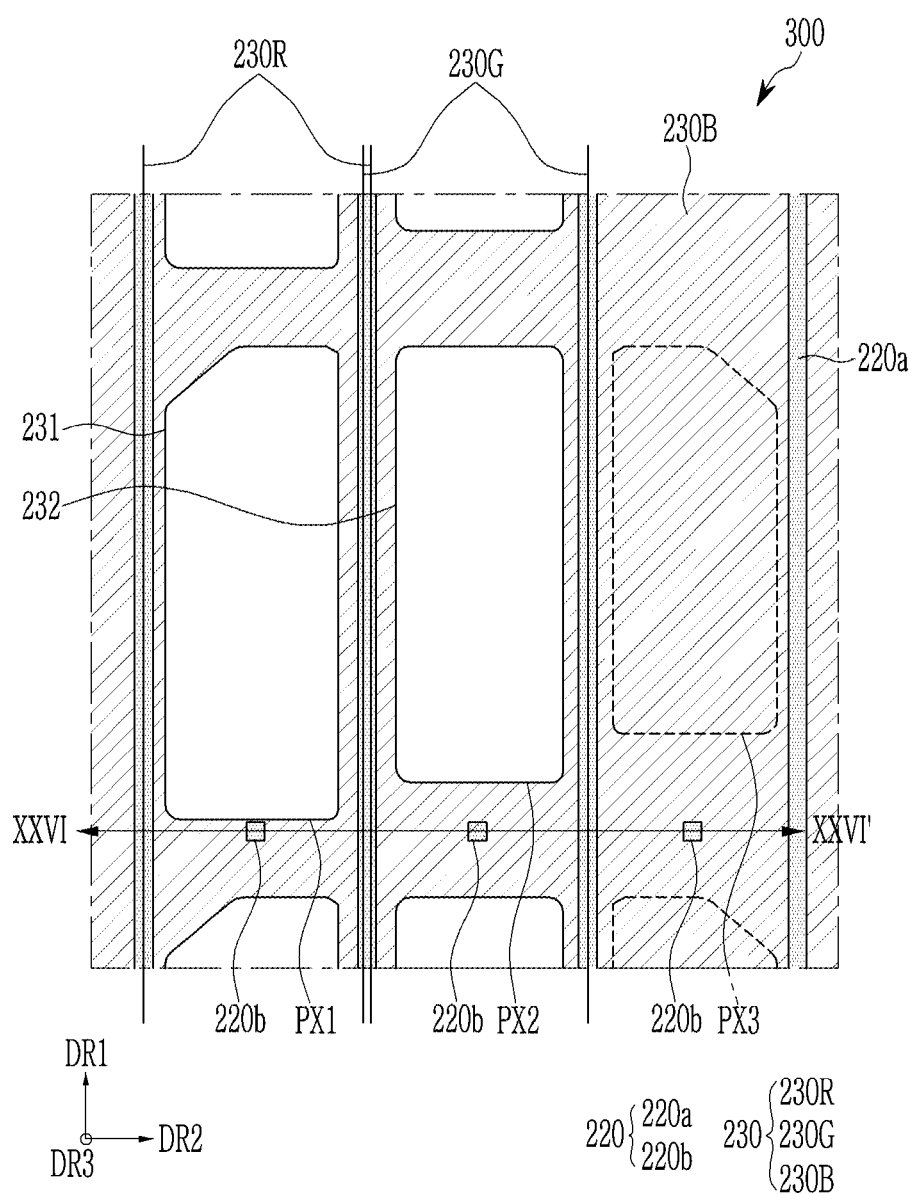
FIG. 25 is a top plan of a color conversion panel of a display device according an alternative embodiment.
Figure 26:
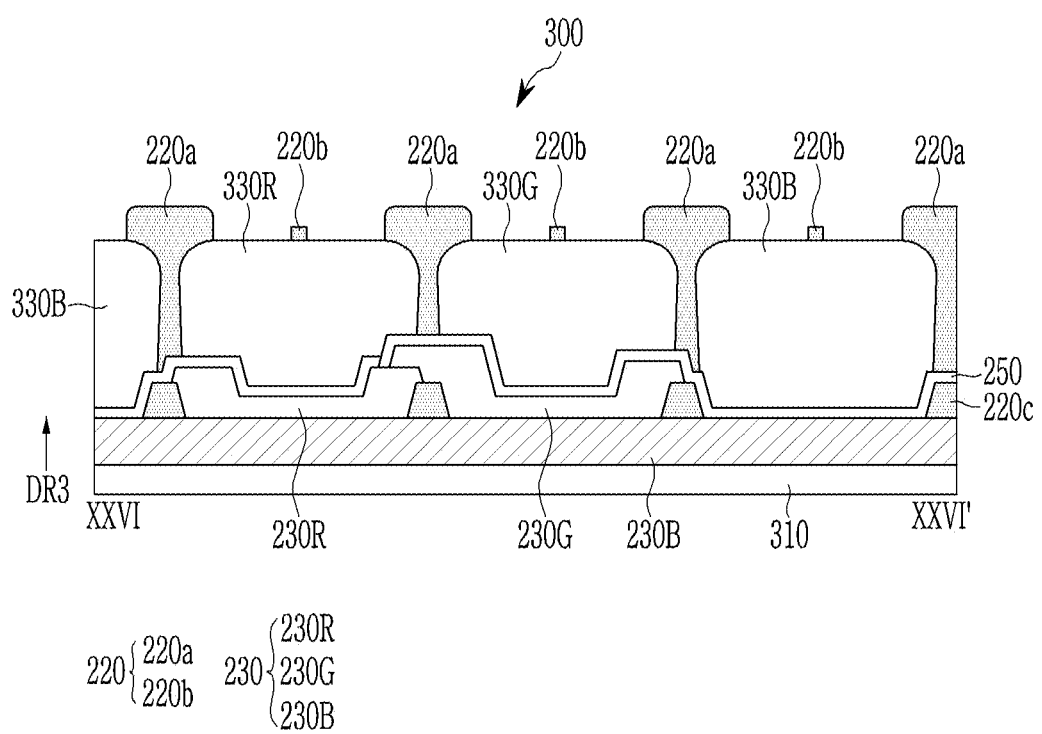
FIG. 26 is a cross-sectional view of FIG. 25, taken along line XXVI-XXVI'.

FIG. 25 is a top plan view of a color conversion panel of a display device according to another alternative embodiment. FIG. 26 is a cross-sectional view of FIG. 25, taken along line XXVI-XXVI'.

An embodiment of a color conversion panel of a display device shown in FIGS. 25 and 26 is substantially the same as the embodiment of FIG. 23 and FIG. 24, except that a second light blocking member 220b is formed not in the shape of a bar but in the shape of a dot. The same or like elements shown in FIGS. 9 and 10 have been labeled with the same reference characters as used above to describe the embodiments of the color conversion panel shown in FIG. 7, and any repetitive detailed description thereof will be omitted.

In an embodiment, as described above, the color conversion panel 300 may have a structure in which the first color filter 230R, the second color filter 230G and the third color filter 230B contact the color conversion substrate 310 of the color conversion panel 300, and the third light blocking member 220c does not directly contact the color conversion substrate 310. However, this is merely exemplary, and the structure of the color filter is not limited thereto.

Figure 27:
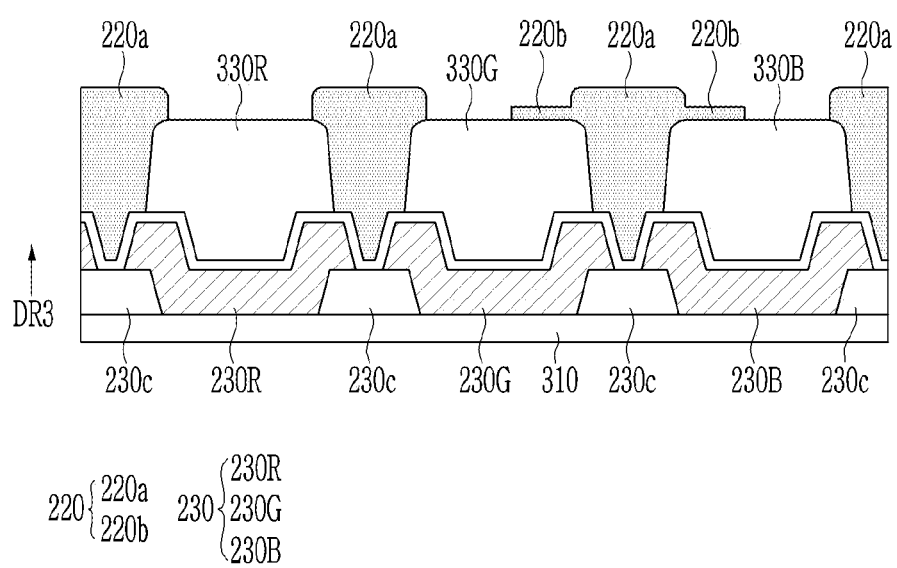
FIG. 27 is a cross-sectional view of a color conversion panel of a display device according to an alternative embodiment.

FIG. 27 is a cross-sectional view of a color conversion panel of a display device according to another alternative embodiment.

An embodiment of a color conversion panel of a display device shown in FIG. 27 is substantially the same as the embodiment of FIG. 3, except that fourth light blocking members 230c that are spaced apart from each other are disposed on a color conversion substrate 310, and a first color filter 230R, a second color filter 230G, and a third color filter 230B are respectively disposed between the separated fourth light blocking members 230c.

In an embodiment of FIG. 1, the third color filter 230B is disposed over the entire surface of the color conversion substrate 310, except for the first opening 231 and the second opening 232. In an alternative embodiment, as shown in FIG. 27, the third color filter 230B is not entirely disposed but is disposed in an area where light of blue is emitted. The same or like elements shown in FIG. 27 have been labeled with the same reference characters as used above to describe the embodiments of the color conversion panel shown in FIGS. 1 and 3, and any repetitive detailed description thereof will be omitted.

Figure 28:
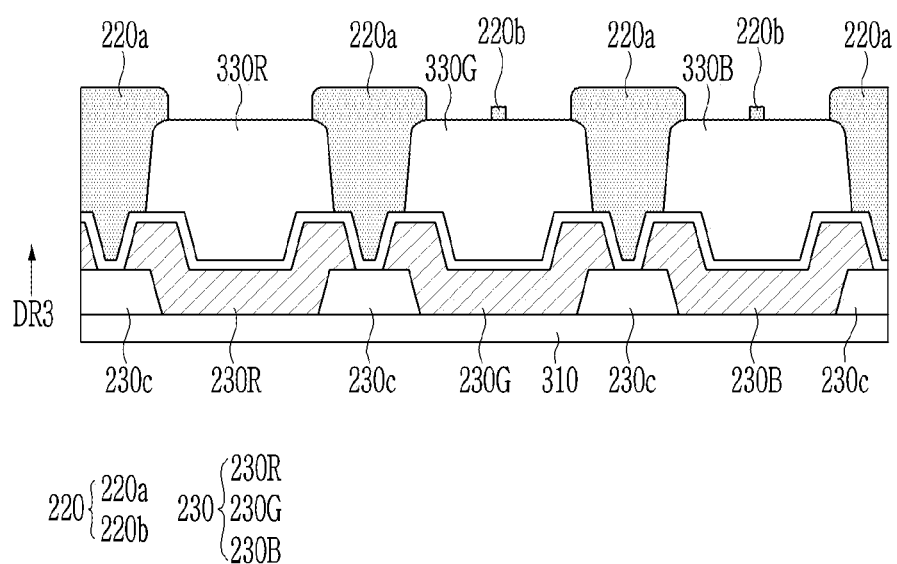
FIG. 28 is a cross-sectional view of a color conversion panel of a display device according to an alternative embodiment.

FIG. 28 is a cross-sectional view of a color conversion panel of a display device according to another alternative embodiment.

An embodiment of a color conversion panel of a display device shown in FIG. 28 is substantially the same as the embodiment of FIG. 8, except for the shapes of a first color filter 230R, a second color filter 230G, and a third color filter 230B. The same or like elements shown in FIG. 28 have been labeled with the same reference characters as used above to describe the embodiments of the color conversion panel shown in FIG. 8, and any repetitive detailed description thereof will be omitted.

Figure 29:
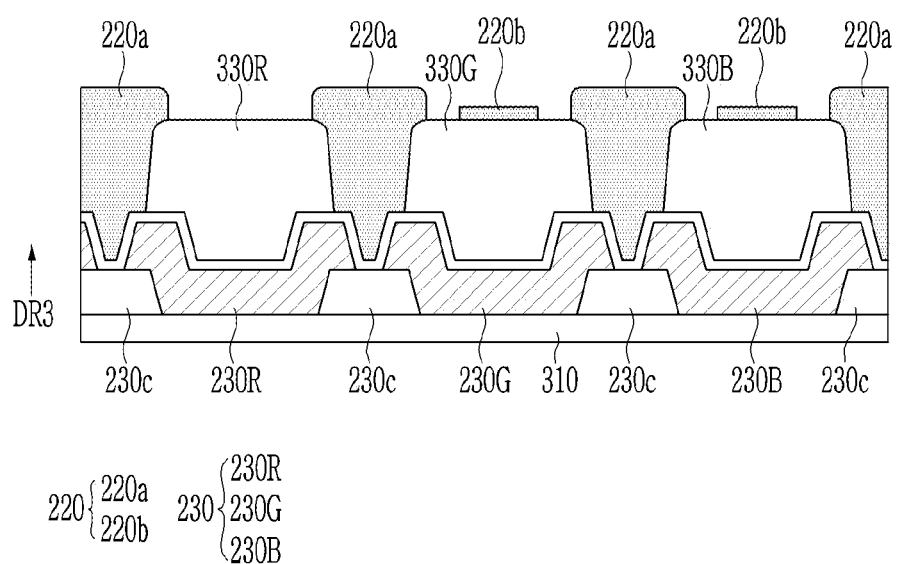
FIG. 29 is a cross-sectional view of a color conversion panel of a display device according to an alternative embodiment.

FIG. 29 is a cross-sectional view of a color conversion panel of a display device according to another alternative embodiment.

An embodiment of a color conversion panel of a display device shown in FIG. 29 is substantially the same as the embodiment of FIG. 10, except for the shapes of a first color filter 230R, a second color filter 230G, and a third color filter 230B. The same or like elements shown in FIG. 29 have been labeled with the same reference characters as used above to describe the embodiments of the color conversion panel shown in FIG. 10, and any repetitive detailed description thereof will be omitted.

Figure 30:
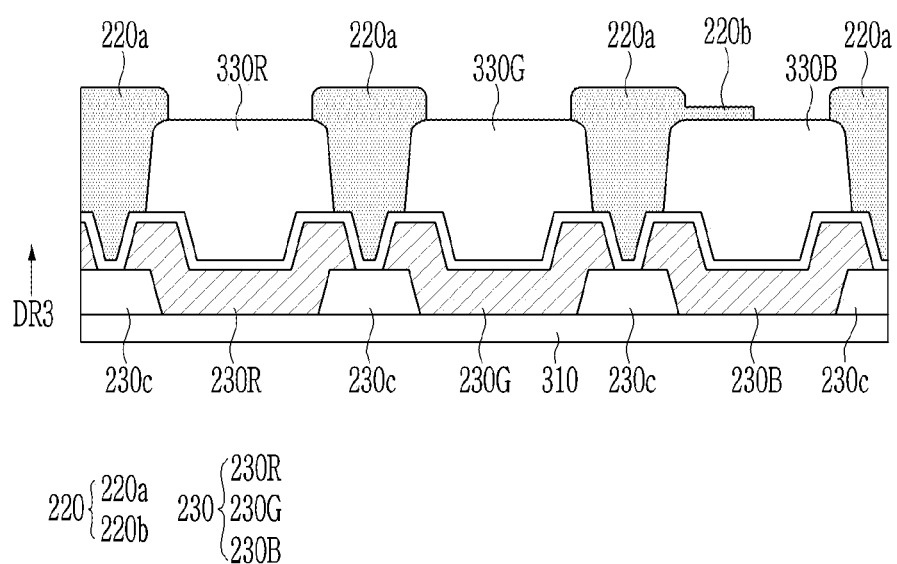
FIG. 30 is a cross-sectional view of a color conversion panel of a display device according to an alternative embodiment.

FIG. 30 is a cross-sectional view of a color conversion panel of a display device according to another alternative embodiment.

An embodiment of a color conversion panel of a display device shown in FIG. 30 is substantially the same as the embodiment of FIG. 12, except for the shapes of a first color filter 230R, a second color filter 230G, and a third color filter 230B. The same or like elements shown in FIG. 30 have been labeled with the same reference characters as used above to describe the embodiments of the color conversion panel shown in FIG. 12, and any repetitive detailed description thereof will be omitted.

Figure 31:
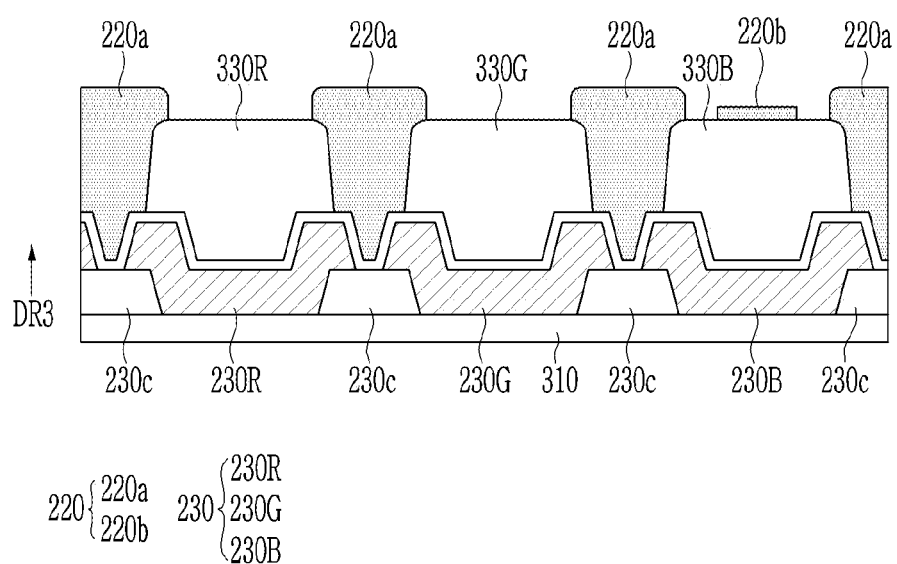
FIG. 31 is a cross-sectional view of a color conversion panel of a display device according to an alternative embodiment.

FIG. 31 is a cross-sectional view of a color conversion panel of a display device according to another alternative embodiment.

An embodiment of a color conversion panel of a display device shown in FIG. 31 is substantially the same as the embodiment of FIG. 14, except for the shapes of a first color filter 230R, a second color filter 230G, and a third color filter 230B. The same or like elements shown in FIG. 31 have been labeled with the same reference characters as used above to describe the embodiments of the color conversion panel shown in FIG. 14, and any repetitive detailed description thereof will be omitted.

Figure 32:
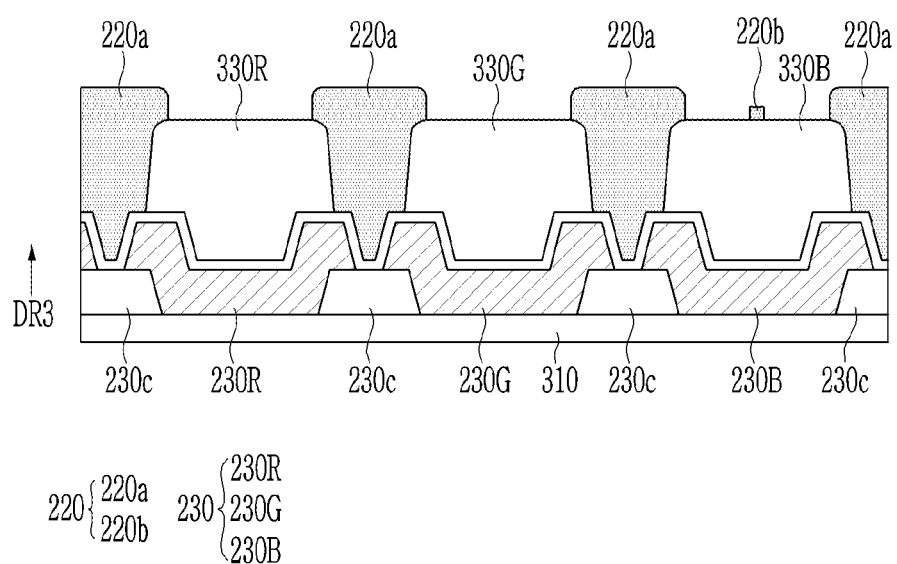
FIG. 32 is a cross-sectional view of a color conversion panel of a display device according to an alternative embodiment.

FIG. 32 is a cross-sectional view of a color conversion panel of a display device according to another alternative embodiment.

An embodiment of a color conversion panel of a display device shown in FIG. 32 is substantially the same as the embodiment of FIG. 16, except for the shapes of a first color filter 230R, a second color filter 230G, and a third color filter 230B. The same or like elements shown in FIG. 32 have been labeled with the same reference characters as used above to describe the embodiments of the color conversion panel shown in FIG. 16, and any repetitive detailed description thereof will be omitted.

Figure 33:
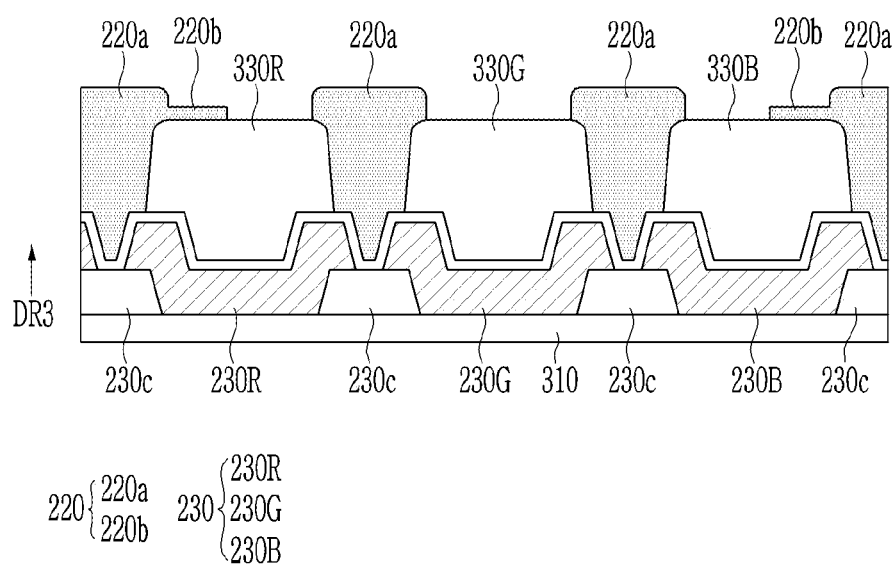
FIG. 33 is a cross-sectional of a color conversion panel of a display device according to an alternative embodiment.

FIG. 33 is a cross-sectional view of a color conversion panel of a display device according to another alternative embodiment.

An embodiment of a color conversion panel of a display device shown in FIG. 33 is substantially the same as the embodiment of FIG. 18, except for the shapes of a first color filter 230R, a second color filter 230G, and a third color filter 230B. The same or like elements shown in FIG. 33 have been labeled with the same reference characters as used above to describe the embodiments of the color conversion panel shown in FIG. 18, and any repetitive detailed description thereof will be omitted.

Figure 34:
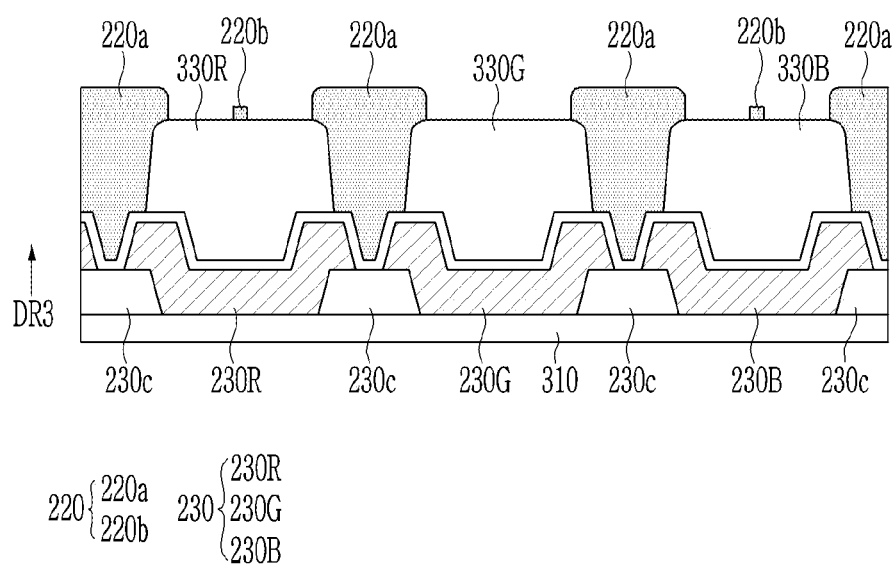
FIG. 34 is a cross-sectional view of a color conversion panel of a display device according to an alternative embodiment.

FIG. 34 is a cross-sectional view of a color conversion panel of a display device according to another alternative embodiment.

An embodiment of a color conversion panel of a display device shown in FIG. 34 is substantially the same as the embodiment of FIG. 20, except for the shapes of a first color filter 230R, a second color filter 230G, and a third color filter 230B. The same or like elements shown in FIG. 34 have been labeled with the same reference characters as used above to describe the embodiments of the color conversion panel shown in FIG. 20, and any repetitive detailed description thereof will be omitted.

Figure 35:
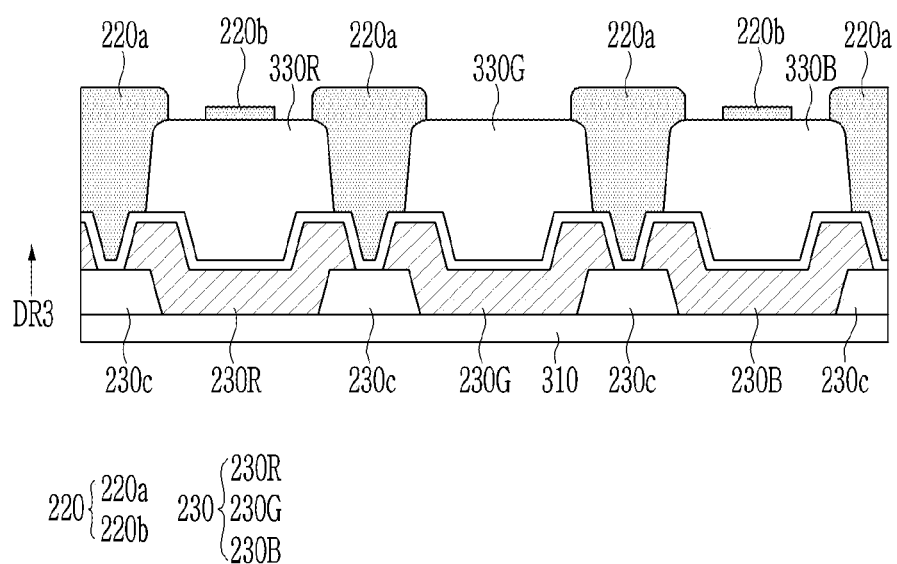
FIG. 35 is a cross-sectional of a color conversion panel of a display device according to an alternative embodiment.

FIG. 35 is a cross-sectional view of a color conversion panel of a display device according to another alternative embodiment.

An embodiment of a color conversion panel of a display device shown in FIG. 35 is substantially the same as the embodiment of FIG. 22, except for the shapes of a first color filter 230R, a second color filter 230G, and a third color filter 230B. The same or like elements shown in FIG. 35 have been labeled with the same reference characters as used above to describe the embodiments of the color conversion panel shown in FIG. 22, and any repetitive detailed description thereof will be omitted.

Figure 36:
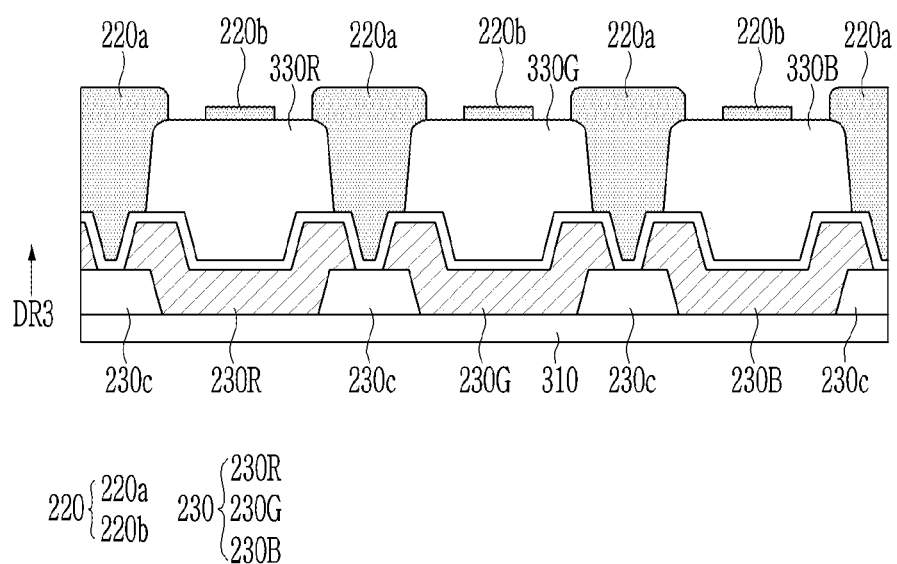
FIG. 36 is a cross-sectional view of a color conversion panel of a display device according to an alternative embodiment.

FIG. 36 is a cross-sectional view of a color conversion panel of a display device according to another alternative embodiment.

An embodiment of a color conversion panel of a display device shown in FIG. 36 is substantially the same as the embodiment of FIG. 24, except for the shapes of a first color filter 230R, a second color filter 230G, and a third color filter 230B. The same or like elements shown in FIG. 36 have been labeled with the same reference characters as used above to describe the embodiments of the color conversion panel shown in FIG. 24, and any repetitive detailed description thereof will be omitted.

Figure 37:
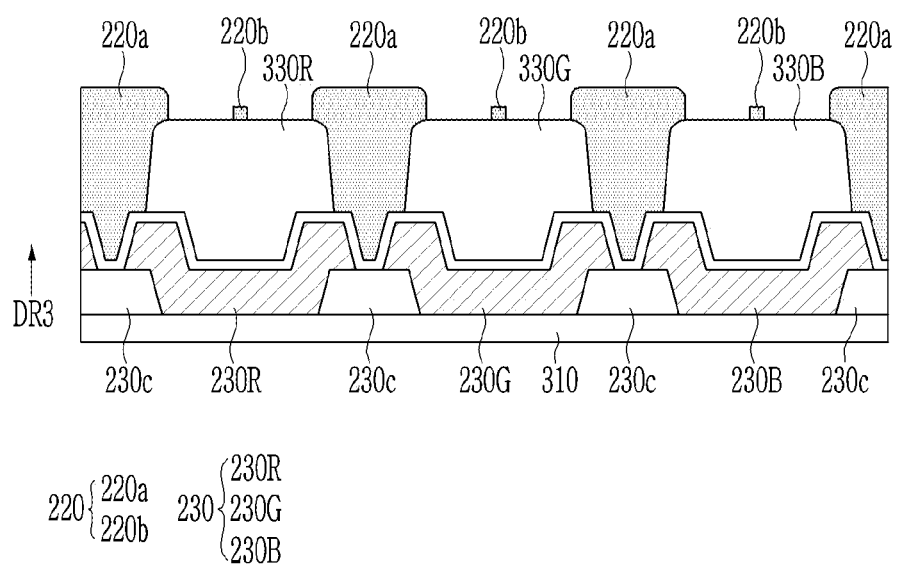
FIG. 37 is a cross-sectional view of a color conversion panel of a display device according to an alternative embodiment.

FIG. 37 is a cross-sectional view of a color conversion panel of a display device according to another alternative embodiment.

An embodiment of a color conversion panel of a display device shown in FIG. 37 is substantially the same as the embodiment of FIG. 26, except for the shapes of a first color filter 230R, a second color filter 230G, and a third color filter 230B. The same or like elements shown in FIG. 37 have been labeled with the same reference characters as used above to describe the embodiments of the color conversion panel shown in FIG. 26, and any repetitive detailed description thereof will be omitted.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, comprising:
a substrate, wherein a first pixel area, a second pixel area, and a third pixel area are defined on the substrate; and
a plurality of light blocking members disposed on the substrate, wherein each of the plurality of light blocking members are disposed between two neighboring pixel areas among the first pixel area, the second pixel area and the third pixel area,
wherein the plurality of light blocking members comprises:
a plurality of first light blocking members, each of which continuously extends along a first direction between the two neighboring pixel areas among the first pixel area, the second pixel area and the third pixel area; and
a second light blocking member disposed along a second direction perpendicular to the first direction,
the second light blocking member is disposed between the third pixel area and a neighboring third pixel area, which neighbors the third pixel area in the first direction,
the second light blocking member is disconnected from at least one selected from the plurality of first light blocking members,
a width of each of the plurality of first light blocking members and a width of the second light blocking member are substantially the same as each other,
a thickness of each of the plurality of first light blocking members in a thickness direction of the substrate, which is perpendicular to the first direction and the second direction, is greater than a thickness of the second light blocking member in the thickness direction, and
a height of a lower surface of each of the plurality of first light blocking members with respect to an upper surface of the substrate is less than a height of a lower surface of the second light blocking member with respect to the upper surface of the substrate.

2. The display device of claim 1, further comprising:
a third color filter disposed directly on the substrate, wherein a first opening is defined through the third color filter to overlap the first pixel area, and a second opening is defined through the third color filter to overlap the second pixel area;
a first color filter disposed in the first opening; and
a second color filter disposed in the second opening.

3. The display device of claim 2, further comprising:
a first color conversion layer disposed to overlap the first color filter;
a second color conversion layer disposed to overlap the second color filter; and
a transmission layer disposed to overlap the third color filter.

4. The display device of claim 1, further comprising:
a plurality of third light blocking members disposed at a distance from each other in the second direction on the substrate;
a first color filter overlapping the first pixel area, a second color filter overlapping the second pixel area, and a third color filter overlapping the third pixel area, wherein the first color filter, the second color filter and the third color filter are disposed between neighboring third light blocking members among the plurality of the third light blocking members;
a first color conversion layer disposed to overlap the first color filter;
a second color conversion layer disposed to overlap the second color filter; and
a transmission layer disposed to overlap the third color filter.

5. The display device of claim 1, wherein
the first pixel area emits a red light,
the second pixel area emits a green light, and
the third pixel area emits a blue light.

6. The display device of claim 5, wherein
a first light blocking member different from the at least one among the plurality of first light blocking members is disposed between the second pixel area and the third pixel area,
the second light blocking member is connected to the first light blocking member, and
an additional second light blocking member is disposed between the second pixel area and a neighboring second pixel area, which neighbors the second pixel area in the first direction.

7. The display device of claim 5, wherein
a first light blocking member different from the at least one among the plurality of first light blocking members is disposed between the second pixel area and the third pixel area,
the second light blocking member is spaced apart from the first light blocking member, and
an additional second light blocking member is disposed between the second pixel area and a neighboring second pixel area, which neighbors the second pixel area in the first direction.

8. The display device of claim 5, wherein
a first light blocking member different from the at least one among the plurality of first light blocking members is disposed between the second pixel area and the third pixel area, and
the second light blocking member is connected to the first light blocking member.

9. The display device of claim 5, wherein
a first light blocking member different from the at least one among the plurality of first light blocking members is disposed between the second pixel area and the third pixel area, and
the second light blocking member is spaced apart from the first light blocking member.

10. The display device of claim 5, wherein
a first light blocking member different from the at least one among the plurality of first light blocking members is disposed between the first pixel area and the third pixel area,
the second light blocking member is connected to the first light blocking member, and
an additional second light blocking member is disposed between the first pixel area and a neighboring first pixel area, which neighbors the first pixel area in the first direction.

11. The display device of claim 5, wherein
a first light blocking member different from the at least one among the first light blocking members is disposed between the first pixel area and the third pixel area,
the second light blocking member is spaced apart from the first light blocking member, and
an additional second light blocking member is disposed between neighboring first pixel areas which neighbor each other in the first direction and between neighboring third pixel areas which neighbor each other in the first direction.

12. The display device of claim 5, wherein
a first light blocking member different from the at least one among the first light blocking members is disposed between the second pixel area and the third pixel area,
the second light blocking member is spaced apart from the first light blocking member, and
additional second light blocking members are disposed between the first pixel area and a neighboring first pixel area, which neighbors the first pixel area in the first direction, and between the second pixel area and a neighboring second pixel area, which neighbors the second pixel area in the first direction, respectively.

13. The display device of claim 1, comprising:
a display substrate which overlaps the substrate; and
a plurality of light emitting diodes disposed on the display substrate,
wherein the plurality of light emitting diodes overlap the first pixel area, the second pixel area and the third pixel area, respectively, and
the light emitting diodes emit a blue light.

14. A display device, comprising:
a substrate;
a first color conversion layer, a second color conversion layer, and a transmission layer which are disposed on the substrate, wherein each of the first color conversion layer, the second color conversion layer and the transmission layer continuously extends in a first direction;
a plurality of light blocking members disposed on the first color conversion layer, the second color conversion layer, and the transmission layer,
wherein the first color conversion layer, the second color conversion layer, and the transmission layer are spaced apart from each other in a second direction perpendicular to the first direction, and
wherein the plurality of light blocking members comprise:
a first light blocking member which continuously extends along the first direction, and fills a separation space between two neighboring color conversion layers among the first color conversion layer, the second color conversion layer, and the transmission layer; and
a second light blocking member disposed in the second direction,
wherein the second light blocking member overlaps the two neighboring color conversion layers in a thickness direction of the substrate, which is perpendicular to the first direction and the second direction,
a width of the first light blocking member and a width of the second light blocking member are substantially the same as each other,
a thickness of the first light blocking member in the thickness direction is greater than a thickness of the second light blocking member in the thickness direction, and
a height of a lower surface of each of the plurality of first light blocking members with respect to an upper surface of the substrate is less than a height of a lower surface of the second light blocking member with respect to the upper surface of the substrate.

15. The display device of claim 14, wherein the second light blocking member is disposed on the transmission layer.

16. The display device of claim 15, wherein the second light blocking member is connected to the first light blocking member.

17. The display device of claim 16, wherein the second light blocking member is disposed on the first color conversion layer or the second color conversion layer.

18. The display device of claim 15, wherein the second light blocking member is spaced apart from the first light blocking member.

19. The display device of claim 18, wherein the second light blocking member is disposed on the first color conversion layer or the second color conversion layer.

20. The display device of claim 14, wherein
the first color conversion layer converts a blue light to a red light, and
the second color conversion layer converts the blue light to a green light.

* * * * *